United States Patent
Lin et al.

(10) Patent No.: US 8,319,354 B2
(45) Date of Patent: Nov. 27, 2012

(54) SEMICONDUCTOR CHIP WITH POST-PASSIVATION SCHEME FORMED OVER PASSIVATION LAYER

(75) Inventors: Mou-Shiung Lin, Hsin-Chu (TW);
Hsin-Jung Lo, Taipei (TW);
Chien-Kang Chou, Tainen Hsien (TW);
Chiu-Ming Chou, Kao-hsiung (TW);
Ching-San Lin, Taichung County (TW)

(73) Assignee: Megica Corporation, Hsinchu (TW)

( * ) Notice: Subject to any disclaimer, the term of this patent is extended or adjusted under 35 U.S.C. 154(b) by 0 days.

(21) Appl. No.: 13/181,255

(22) Filed: Jul. 12, 2011

(65) Prior Publication Data
US 2011/0266669 A1    Nov. 3, 2011

Related U.S. Application Data

(63) Continuation of application No. 12/132,626, filed on Jun. 4, 2008, now Pat. No. 8,004,092, which is a continuation of application No. 11/262,184, filed on Oct. 28, 2005, now Pat. No. 7,397,121.

(51) Int. Cl.
*H01L 23/52* (2006.01)
*H01L 23/48* (2006.01)
*H01L 29/40* (2006.01)

(52) U.S. Cl. ............... 257/781; 257/E23.021; 257/737; 257/758; 257/786; 438/108; 438/614

(58) Field of Classification Search ............ 257/E23.02, 257/E23.021, E23.161, 506, 723, 737, 758, 257/780, 784, 786, 781; 438/106, 108, 132, 438/612, 614, 617
See application file for complete search history.

(56) References Cited

U.S. PATENT DOCUMENTS

| | | |
|---|---|---|
| 3,668,484 A | 6/1972 | Greig et al. |
| 4,685,998 A | 8/1987 | Quinn et al. |
| 4,825,276 A | 4/1989 | Kobayashi |
| 4,880,708 A | 11/1989 | Sharma et al. |
| 5,083,187 A | 1/1992 | Lamson et al. |
| 5,226,232 A | 7/1993 | Boyd |
| 5,468,984 A | 11/1995 | Efland et al. |
| 5,532,512 A | 7/1996 | Fillion et al. |
| 5,554,940 A | 9/1996 | Hubacher |
| 5,631,499 A | 5/1997 | Hosomi et al. |
| 5,656,858 A | 8/1997 | Kondo et al. |

(Continued)

FOREIGN PATENT DOCUMENTS
EP    1536469 A1    6/2005

OTHER PUBLICATIONS

Bohr, M. "The New Era of Scaling in an SoC World," International Solid-State Circuits Conference (2009) pp. 23-28.

(Continued)

*Primary Examiner* — Chris Chu
(74) *Attorney, Agent, or Firm* — McDermott Will & Emery LLP

(57) ABSTRACT

The invention provides a semiconductor chip comprising an interconnecting structure over said passivation layer. The interconnecting structure comprises a first contact pad connected to a second contact pad exposed by an opening in a passivation layer. A metal bump is on the first contact pad and over multiple semiconductor devices, wherein the metal bump has more than 50 percent by weight of gold and has a height of between 8 and 50 microns.

33 Claims, 14 Drawing Sheets

U.S. PATENT DOCUMENTS

| | | | |
|---|---|---|---|
| 5,659,201 | A | 8/1997 | Wollesen |
| 5,691,248 | A | 11/1997 | Cronin et al. |
| 5,726,502 | A | 3/1998 | Beddingfield |
| 5,742,094 | A | 4/1998 | Ting |
| 5,792,594 | A | 8/1998 | Brown et al. |
| 5,834,844 | A | 11/1998 | Akagawa et al. |
| 5,854,513 | A | 12/1998 | Kim |
| 5,879,964 | A | 3/1999 | Paik et al. |
| 5,883,435 | A | 3/1999 | Geffken et al. |
| 5,895,947 | A | 4/1999 | Lee et al. |
| 6,011,314 | A | 1/2000 | Leibovitz et al. |
| 6,013,571 | A | 1/2000 | Morrell |
| 6,022,792 | A | 2/2000 | Ishii et al. |
| 6,077,726 | A | 6/2000 | Mistry et al. |
| 6,103,552 | A | 8/2000 | Lin |
| 6,107,180 | A | 8/2000 | Munroe et al. |
| 6,144,100 | A | 11/2000 | Shen et al. |
| 6,159,837 | A | 12/2000 | Yamaji et al. |
| 6,166,444 | A * | 12/2000 | Hsuan et al. ............... 257/777 |
| 6,181,569 | B1 | 1/2001 | Chakravorty |
| 6,184,143 | B1 | 2/2001 | Ohashi et al. |
| 6,187,680 | B1 | 2/2001 | Costrini et al. |
| 6,229,711 | B1 | 5/2001 | Yoneda |
| 6,287,893 | B1 | 9/2001 | Elenius et al. |
| 6,319,846 | B1 | 11/2001 | Lin et al. |
| 6,359,328 | B1 | 3/2002 | Dubin |
| 6,362,087 | B1 | 3/2002 | Wang et al. |
| 6,372,619 | B1 | 4/2002 | Huang et al. |
| 6,380,061 | B1 | 4/2002 | Kobayashi et al. |
| 6,383,916 | B1 | 5/2002 | Lin |
| 6,426,281 | B1 | 7/2002 | Lin et al. |
| 6,429,120 | B1 | 8/2002 | Ahn et al. |
| 6,458,622 | B1 * | 10/2002 | Keser et al. ............... 438/106 |
| 6,462,426 | B1 | 10/2002 | Kelkar et al. |
| 6,472,745 | B1 | 10/2002 | Iizuka |
| 6,479,900 | B1 | 11/2002 | Shinogi et al. |
| 6,534,853 | B2 | 3/2003 | Liu et al. |
| 6,596,560 | B1 * | 7/2003 | Hsu ............... 438/108 |
| 6,605,525 | B2 | 8/2003 | Lu et al. |
| 6,614,091 | B1 | 9/2003 | Downey et al. |
| 6,617,655 | B1 | 9/2003 | Estacio et al. |
| 6,620,728 | B2 | 9/2003 | Lin |
| 6,639,299 | B2 * | 10/2003 | Aoki ............... 257/531 |
| 6,642,136 | B1 | 11/2003 | Lee et al. |
| 6,646,347 | B2 | 11/2003 | Mercado et al. |
| 6,653,563 | B2 | 11/2003 | Bohr |
| 6,664,141 | B1 | 12/2003 | Castagnetti et al. |
| 6,683,380 | B2 | 1/2004 | Efland et al. |
| 6,707,124 | B2 | 3/2004 | Wachtler et al. |
| 6,707,159 | B1 | 3/2004 | Kumamoto et al. |
| 6,762,122 | B2 | 7/2004 | Mis et al. |
| 6,780,748 | B2 | 8/2004 | Yamaguchi et al. |
| 6,841,872 | B1 | 1/2005 | Ha et al. |
| 6,853,076 | B2 | 2/2005 | Datta et al. |
| 6,853,078 | B2 | 2/2005 | Yamaya et al. |
| 6,861,762 | B1 | 3/2005 | Rotem |
| 6,891,248 | B2 | 5/2005 | Akram et al. |
| 6,900,538 | B2 | 5/2005 | Alter et al. |
| 6,917,119 | B2 | 7/2005 | Lee et al. |
| 6,940,169 | B2 | 9/2005 | Jin et al. |
| 6,943,440 | B2 | 9/2005 | Kim et al. |
| 6,959,856 | B2 | 11/2005 | Oh et al. |
| 6,963,136 | B2 | 11/2005 | Shinozaki et al. |
| 6,977,435 | B2 | 12/2005 | Kim et al. |
| 6,998,711 | B1 | 2/2006 | Farrar |
| 7,041,537 | B2 * | 5/2006 | Akram et al. ............... 438/127 |
| 7,043,830 | B2 * | 5/2006 | Farnworth ............... 29/842 |
| 7,078,331 | B2 | 7/2006 | Kwon et al. |
| 7,220,657 | B2 | 5/2007 | Ihara et al. |
| 7,239,028 | B2 | 7/2007 | Anzai |
| 7,319,277 | B2 | 1/2008 | Lin |
| 7,394,164 | B2 | 7/2008 | Peng et al. |
| 7,397,121 | B2 | 7/2008 | Chou et al. |
| 7,425,767 | B2 * | 9/2008 | Lin ............... 257/781 |
| 7,452,803 | B2 * | 11/2008 | Lin et al. ............... 438/624 |
| 7,465,654 | B2 * | 12/2008 | Chou et al. ............... 438/614 |
| 7,470,927 | B2 * | 12/2008 | Lee et al. ............... 174/524 |
| 7,489,037 | B2 * | 2/2009 | Chien et al. ............... 257/737 |
| 7,528,495 | B2 * | 5/2009 | Yang ............... 257/786 |
| 7,531,898 | B2 | 5/2009 | Batchelor et al. |
| 7,545,037 | B2 | 6/2009 | Lee |
| 7,566,650 | B2 * | 7/2009 | Lin et al. ............... 438/613 |
| 7,586,181 | B2 * | 9/2009 | Kikuchi ............... 257/684 |
| 7,622,364 | B2 * | 11/2009 | Adkisson et al. ............ 438/462 |
| 8,004,092 | B2 | 8/2011 | Lin et al. |
| 2001/0000080 | A1 | 3/2001 | Nozawa |
| 2001/0026021 | A1 | 10/2001 | Honda |
| 2001/0040290 | A1 | 11/2001 | Sakurai et al. |
| 2001/0051426 | A1 | 12/2001 | Pozder et al. |
| 2002/0016079 | A1 | 2/2002 | Dykstra et al. |
| 2002/0043723 | A1 * | 4/2002 | Shimizu et al. ............... 257/758 |
| 2002/0079576 | A1 | 6/2002 | Seshan |
| 2002/0100975 | A1 | 8/2002 | Kanda |
| 2002/0158334 | A1 | 10/2002 | Vu et al. |
| 2003/0006062 | A1 | 1/2003 | Stone et al. |
| 2003/0008133 | A1 | 1/2003 | Paik et al. |
| 2003/0020163 | A1 | 1/2003 | Hung et al. |
| 2003/0052409 | A1 * | 3/2003 | Matsuo et al. ............... 257/737 |
| 2003/0080416 | A1 | 5/2003 | Jorger et al. |
| 2003/0127734 | A1 | 7/2003 | Lee et al. |
| 2003/0162383 | A1 | 8/2003 | Yamaya et al. |
| 2003/0168733 | A1 | 9/2003 | Hashimoto |
| 2003/0218246 | A1 | 11/2003 | Abe et al. |
| 2003/0219966 | A1 | 11/2003 | Jin et al. |
| 2004/0007779 | A1 | 1/2004 | Arbuthnot et al. |
| 2004/0023450 | A1 | 2/2004 | Katagiri et al. |
| 2004/0029404 | A1 | 2/2004 | Lin |
| 2004/0048202 | A1 | 3/2004 | Lay et al. |
| 2004/0070042 | A1 | 4/2004 | Lee et al. |
| 2004/0145052 | A1 | 7/2004 | Ueno et al. |
| 2004/0166659 | A1 | 8/2004 | Lin et al. |
| 2004/0188839 | A1 | 9/2004 | Ohtsuka et al. |
| 2004/0253801 | A1 | 12/2004 | Lin |
| 2005/0017343 | A1 | 1/2005 | Kwon et al. |
| 2005/0121804 | A1 * | 6/2005 | Kuo et al. ............... 257/781 |
| 2006/0012041 | A1 | 1/2006 | Chou et al. |
| 2006/0060961 | A1 | 3/2006 | Lin et al. |
| 2006/0076678 | A1 | 4/2006 | Kim et al. |
| 2006/0091540 | A1 * | 5/2006 | Chou et al. ............... 257/737 |

OTHER PUBLICATIONS

Bohr, M. "The New Era of Scaling in an SoC World," International Solid-State Circuits Conference (2009) Presentation Slides 1-66.

Search Report for Taiwan Patent Application No. 095140066 dated Oct. 15, 2009 with English Translation.

Edelstein D. C., "Advantages of Copper Interconnects," Proceedings of the 12th International IEEE VLSI Multilevel Interconnection Conference, 1995, 301-307.

Edelstein D., et al., "Full Copper Wiring in a Sub-0.25 pm CMOS ULS Technology," Technical Digest IEEE International Electron Devices Meeting, 1997, 773-776.

Gao X., et al., "An improved electrostatic discharge protection structure for reducing triggering voltage and parasitic capacitance," Solid-State Electronics, 2003, 1105-1110.

Geffken R. M., "An Overview of Polyimide Use in Integrated Circuits and Packaging," Proceedings of the Third International Symposium on Ultra Large Scale Integration Science and Technology, 1991, 667-677.

Groves R., et al., "High Q Inductors in a SiGe BiCMOS Process Utilizing Thick Metal Process Add-on Module," Proceedings of the Bipolar/BiCMOS Circuits and Technology Meeting, 1999, 149-152.

Hu C. K., et al., "Copper-Polyimide Wiring Technology for VLSI Circuits," Materials Research Society Symposium Proceedings VLSI V, 1990, 369-373.

Ingerly D., et al., "Low-K Interconnect Stack with Thick Metal 9 Redistribution Layer and Cu Die Bump for 45nm High Volume Manufacturing," International Interconnect Technology Conference, 2008, 216-218.

Jenei S., et al., "High Q Inductor Add-on Module in Thick Cu/SiLKTm single damascene," Proceedings from the IEEE International Interconnect Technology Conference, 2001, 107-109.

Kumar R., et al., "A Family of 45nm IA Processors," IEEE International Solid- State Circuits Conference, Session 3, Microprocessor Technologies, 2009, vol. 3 (2), 58-59.

Kurd N., et al., "Next Generation Intel® Micro-architecture (Nehalem) Clocking Architecture," Symposium on VLSI Circuits Digest of Technical Papers, 2008, 62-63.

Lee Y. H., et al., "Effect of ESD Layout on the Assembly Yield and Reliability," International Electron Devices Meeting, 2006, pp. 1-4.

Lin M. S., et al., "A New IC Interconnection Scheme and Design Architecture for High Performance ICs at Very Low Fabrication Cost—Post Passivation Interconnection," Proceedings of the IEEE Custom Integrated Circuits Conference, 2003, 533-536.

Lin, M.S. et al., "A New System-on-a-Chip (SOC) Technology High Q Post Passivation Inductors," Proceedings from the 53rd Electronic Components and Technology Conference (May 30, 2003), 2003, 1503-1509.

Lin, M.S. Post Passivation Technology TM—MEGIC ® Way to System Solutions, Presentation given at TSMC Technology Symposium, Japan (Oct. 1, 2003) pp. 1-32.

Luther B., et al., "Planar Copper-Polyimide Back End of the Line Interconnections for ULSI Devices," Proceedings of the 10th International IEEE VLSI Multilevel Interconnection Conference, 1993, 15-21.

Maloney T., et al., "Novel Clamp Circuits for IC Power Supply Protection," IEEE Transactions on Components, Packaging, and Manufacturing Technology, Part C, 1996, vol. 19 (3), 150-161.

Maloney T. J., et al., "Stacked PMOS Clamps for High Voltage Power Supply Protection, 2830," Electrical Overstress Electrostatic Discharge Symposium Proceedings, 1999, 70-77.

Master R., et al., "Ceramic Mini-Ball Grid Array Package for High Speed Device," Proceedings from the 45th Electronic Components and Technology Conference, 1995, 46-50.

MEGIC way to system solutions through bumping and redistribution, Brochure, MEGIC Corp, 2004, pp. 1-3.

Mistry K., et al., "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting, 2007, 247-250.

Roesch W., et al., "Cycling copper flip chip interconnects," Microelectronics Reliability, 2004, vol. 44, 1047-1054.

Sakran N., et al., "The Implementation of the 65nm Dual-Core 64b Merom Processor, Session 5, Microprocessors," IEEE International Solid-State Circuits Conference, 2007, vol. 5 (6), 106-107 and 590.

Theng C., et al., "An Automated Tool Deployment for ESD (Electro-Static- Discharge) Correct-by-Construction Strategy in 90 nm Process," IEEE International Conference on Semiconductor Electronics, 2004, 61-67.

Venkatesan S., et al., "A High Performance 1.8V, 0.20 pm CMOS Technology with Copper Metallization," Technical Digest IEEE International Electron Devices Meeting, 1997, 769-772.

Yeoh A., et al., "Copper Die Bumps (First Level Interconnect) and Low-K Dielectrics in 65nm High Volume Manufacturing," Electronic Components and Technology Conference, 2006, 1611-1615.

Yeoh T. S., "ESD Effects on Power Supply Clamps," Proceedings of the 6th International Sympoisum on Physical & Failure Analysis of Integrated Circuits, 1997, 121-124.

* cited by examiner

SEMICONDUCTOR CHIP WITH POST-PASSIVATION SCHEME FORMED OVER PASSIVATION LAYER

This application is a Continuation of U.S. application Ser. No. 12/132,626, filed on Jun. 4, 2008, now U.S. Pat. No. 8,004,092, which a continuation of U.S. application Ser. No. 11/262,184, filed on Oct. 28, 2005, now U.S. Pat. No. 7,397,121, which is related to U.S. application Ser. No. 11/262,182, filed on Oct. 28, 2005, now U.S. Pat. No. 7,547,969, all of which are herein incorporated by reference in their entirety.

BACKGROUND OF THE PRESENT INVENTION

1. Field of Invention

The invention relates to a semiconductor chip, and particularly to a semiconductor chip with a post-passivation scheme formed over a passivation layer.

2. Description of Related Arts

The Au bumps are used for the TCP (tape carrier packaging) and COG (chip on glass) assembly in the LCD driver ICs. Due to the finer pixel demand and ever-increasing panel size, the required number of I/O layouts is increasing. In the conventional design, referring to FIG. 1, the chip 101 includes a single row of IO contact pads 102 exposed by openings in a passivation layer. The IO contact pads 102 are at the periphery of the chip 101. Au bumps 103 are formed on the IO contact pads 102. There are no semiconductor devices, such MOS devices or transistors, under the IO contact pads 102.

With the increasing of the number of the IOs, the size of the Au bumps 103 have to be shrunk to maintain the chip 101 in a small size. Then it becomes technically difficult and economically expensive in connecting the chip 101 to an external circuitry.

Some designers design the contact pads 202 of the chip 201 aligned in two rows, as shown in FIGS. 2 and 3, with the contact pads 202 exposed by openings in a passivation layer 204. There are no semiconductor devices 205, such MOS devices or transistors, under the contact pads 202 and Au bumps 203, neither. Then the chip 201 cannot be maintained in a small size since the underlying semiconductor substrate 206 vacates a peripheral region 207 having no semiconductor devices.

SUMMARY OF THE PRESENT INVENTION

The objective of the invention is to provide multiple metal bumps that are soft and ductile to buffer and absorb the shock energy during assembling the semiconductor chip and an external circuitry or to buffer and absorb the shock energy during a probe or testing card is poked in the metal bumps. Therefore, the invention allows the semiconductor devices under the metal bumps without being damaged if a shock happens to the metal bumps.

Another objective of the invention is to provide an RDL layer that is employed to change the I/O layout from a fine-pitched contact pad exposed by an opening in the passivation layer to a coarse-pitched contact pad formed over the fine-pitched contact pad or a passivation layer. Therefore, the process for forming a metal bump on the RDL layer is easily performed.

Another objective of the invention is to provide a semiconductor chip where a peripheral region of a semiconductor substrate close to the edge thereof may have semiconductor devices formed therein or on. The rate of the semiconductor devices occupying the top surface of the semiconductor substrate is improved and therefore the semiconductor chip can be shrunk.

DETAILED DESCRIPTION OF THE PREFERRED EMBODIMENT

First Embodiment

Figure 1:
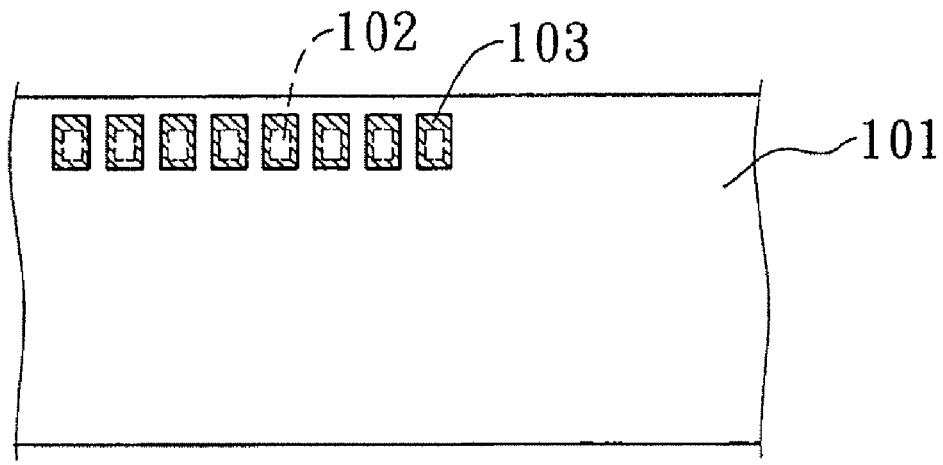
FIG. 1 illustrates a top view of a conventional semiconductor chip.
Figure 2:
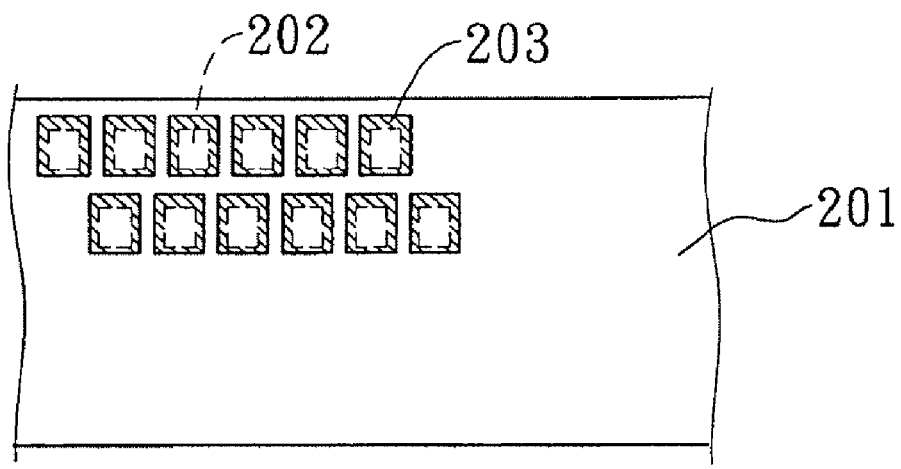
FIG. 2 illustrates a top view of another conventional semiconductor chip.
Figure 3:
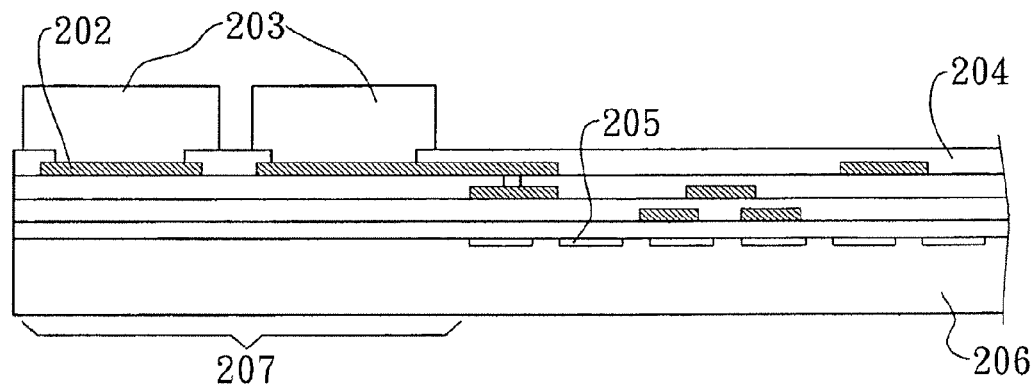
FIG. 3 illustrates a cross-sectional view of FIG. 2.
Figure 4:
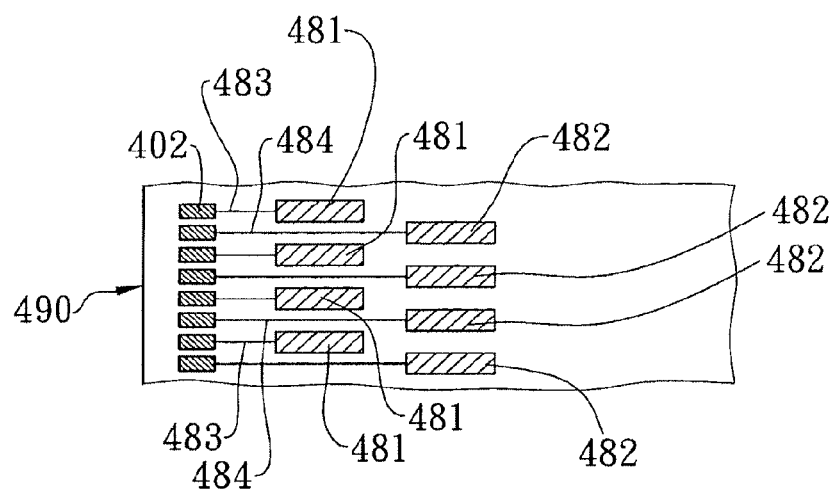
FIG. 4 illustrates a top view of a semiconductor chip according to the invention.
Figure 4A:
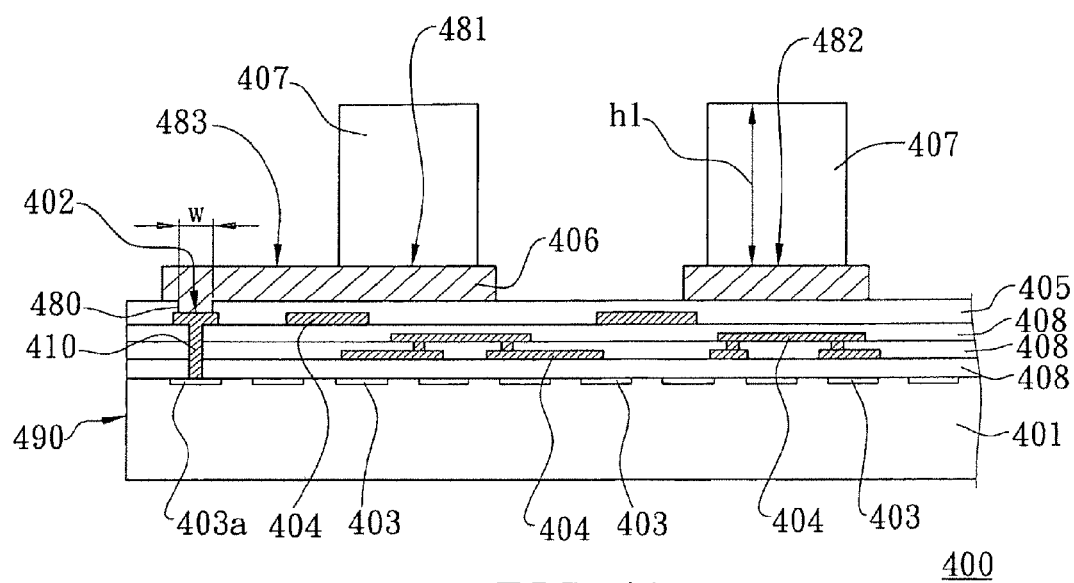
FIG. 4A illustrates a cross-sectional view of FIG. 4.

Referring to FIG. 4A, an embodiment of the invention, it is the cross section of an semiconductor chip 400 including a semiconductor substrate 401, such as silicon substrate, GaAs substrate or SiGe substrate, with multiple semiconductor devices 403, such as CMOS devices, transistors, resistors, capacitors, or inductors, formed therein or on, multiple thin-film dielectric layers 408, such as silicon oxide, over the semiconductor substrate 401, multiple thin-film metal layers 404, formed by a process comprising sputtering an aluminum layer and then patterning the aluminum layer, or by a process comprising electroplating a copper layer in opening in a dielectric layer and on the dielectric layer and then removing the copper layer outside the opening in the dielectric layer using a CMP process, and a passivation layer 405 over the thin-film dielectric layers 408 and thin-film metal layers 404, multiple openings 480 in the passivation layer 405 exposing multiple contact pads 402 provided by the topmost one of the thin-film metal layers 404. The openings 480 have a largest transverse dimension w of between 0.1 and 30 microns, for example. The passivation layer 405 should be thick enough to prevent moisture, impurities, mobile ions or transitional metal elements from moving through the passivation layer 405. The passivation layer 405 is constructed of a silicon oxide compound, a silicon nitride compound, phosphosilicate glass (PSG), a silicon oxynitride compound or a composite formed by depositing the above materials.

In a case, the passivation layer 405 can be formed by first depositing a silicon-oxide layer with a thickness of between 0.2 and 1.0 microns using a PECVD process, then depositing a silicon-nitride layer with a thickness of between 0.2 and 1.0 microns on the silicon-oxide layer using a PECVD process.

In another case, the passivation layer 405 can be formed by first depositing a silicon-oxide layer with a thickness of between 0.2 and 1.0 microns using a PECVD process, then depositing a silicon-oxynitride layer with a thickness of between 0.05 and 0.5 microns on the silicon-oxide layer using a PECVD process, and then depositing a silicon-nitride layer with a thickness of between 0.2 and 1.0 microns on the silicon-oxynitride layer using a PECVD process.

In another case, the passivation layer 405 can be formed by first depositing a silicon-oxynitride layer with a thickness of between 0.05 and 0.5 microns using a PECVD process, then depositing a silicon-oxide layer with a thickness of between 0.2 and 1.0 microns on the silicon-oxynitride layer using a PECVD process, and then depositing a silicon-nitride layer with a thickness of between 0.2 and 1.0 microns on the silicon-oxide layer using a PECVD process.

In another case, the passivation layer 405 can be formed by first depositing a silicon-oxide layer with a thickness of between 0.2 and 1.0 microns using a PECVD process, then depositing a silicon-oxide layer with a thickness of between 0.5 and 3.0 microns on the PECVD silicon-oxide layer using a spin-coating process, then depositing a silicon-oxide layer with a thickness of between 0.2 and 1.0 microns on the spin-coated silicon-oxide layer using a PECVD process, and then depositing a silicon-nitride layer with a thickness of between 0.2 and 1.0 microns on the PECVD silicon-oxide layer using a PECVD process.

In another case, the passivation layer 405 can be formed by first depositing a silicon-oxide layer with a thickness of between 0.5 and 3.0 microns using a HDP-CVD process, and then depositing a silicon-nitride layer with a thickness of between 0.2 and 1.0 microns on the silicon-oxide layer using a PECVD process.

In another case, the passivation layer 405 can be formed by first depositing a USG layer with a thickness of between 0.2 and 3 microns, then depositing a layer of TEOS, BPSG or PSG with a thickness of between 0.5 and 3 microns on the USG layer, and then depositing a silicon-nitride layer with a thickness of between 0.2 and 1.0 microns on the layer of TEOS, BPSG or PSG using a PECVD process.

In another case, the passivation layer 405 can be formed by optionally first depositing a first silicon-oxynitride layer with a thickness of between 0.05 and 0.5 microns on the silicon-oxide layer using a PECVD process, then depositing a silicon-oxide layer with a thickness of between 0.2 and 1.0 microns optionally on the first silicon-oxynitride layer using a PECVD process, then optionally depositing a second silicon-oxynitride layer with a thickness of between 0.05 and 0.5 microns on the silicon-oxide layer using a PECVD process, then depositing a silicon-nitride layer with a thickness of between 0.2 and 1.0 microns on the second silicon-oxynitride layer or on the silicon-oxide layer using a PECVD process, then optionally depositing a third silicon-oxynitride layer with a thickness of between 0.05 and 0.5 microns on the silicon-nitride layer using a PECVD process, and then depositing a silicon-oxide layer with a thickness of between 0.2 and 1.0 microns on the third silicon-oxynitride layer or on the silicon-nitride layer using a PECVD process.

In another case, the passivation layer 405 can be formed by first depositing a first silicon-oxide layer with a thickness of between 0.2 and 1.0 microns using a PECVD process, then depositing a second silicon-oxide layer with a thickness of between 0.5 and 3.0 microns on the first silicon-oxide layer using a spin-coating process, then depositing a third silicon-oxide layer with a thickness of between 0.2 and 1.0 microns on the second silicon-oxide layer using a PECVD process, then depositing a silicon-nitride layer with a thickness of between 0.2 and 1.0 microns on the third silicon-oxide layer using a PECVD process, and then depositing a fourth silicon-oxide layer with a thickness of between 0.2 and 1.0 microns on the silicon-nitride layer using a PECVD process.

In another case, the passivation layer 405 can be formed by first depositing a silicon-oxide layer with a thickness of between 0.5 and 3.0 microns using a HDP-CVD process, then depositing a silicon-nitride layer with a thickness of between 0.2 and 1.0 microns on the silicon-oxide layer using a PECVD process, and then depositing another silicon-oxide layer with a thickness of between 0.5 and 3.0 microns on the silicon-nitride layer using a HDP-CVD process.

Referring to FIG. 4A, a patterned metal layer 406 working as a redistribution layer (RDL) is deposited on the passivation layer 405 and connected to the contact pads 402 through the openings 480 in the passivation layer 405. The redistribution layer 406 includes multiple contact pads 481 and 482 used to have metal bumps 407 formed thereon or used to be wirebonded thereto. The contact pads 481 and 482 have positions different from those of the contact pads 402 exposed by the openings 480 in the passivation layer 405 from a top view, as shown in FIG. 4. FIG. 4 is a top view of FIGS. 4A-4N. The contact pads 481 and 482 are placed close to the edge 490 of the semiconductor chip 400. The contact pads 481 are aligned in an external line, while the contact pads 482 are aligned in an internal line. Multiple traces 484 of the patterned metal layer 406 connecting the contact pads 402 exposed by the openings 480 in the passivation layer 405 to the contact pads 482 aligned in the internal line pass through the gap between the neighboring contact pads 481 aligned in the external line. Multiple traces 483 of the patterned metal layer 406 connect the contact pads 402 exposed by the openings 480 in the passivation layer 405 to the contact pads 481 aligned in the internal line.

Referring to FIG. 4A, the metal bumps 407 are formed over the semiconductor devices 403 and thin-film metal layers 404. The metal bumps 407 can be connected to electrical contact pads on a glass substrate, flexible substrate, TAB (tape automated bonding) carrier or printed circuit board. The metal bumps 407 are formed with more than 50 percent by weight of, and preferably with more than 90 percent by weight of, gold, copper, nickel, platinum, palladium, ruthenium or rhodium, for example. The metal bumps 407 have a height h1 of between 8 and 50 microns, and preferably between 10 and 30 microns. The contact pads 402 are formed over an ESD (electrostatic discharge) circuit 403a and connected to the ESD circuit 403a through a metal plug 410. The metal plug 410 has a bottom end joined to a contact of the ESD circuit 403a and a top end joined to the bottom of the contact pads 402.

Figure 4B:
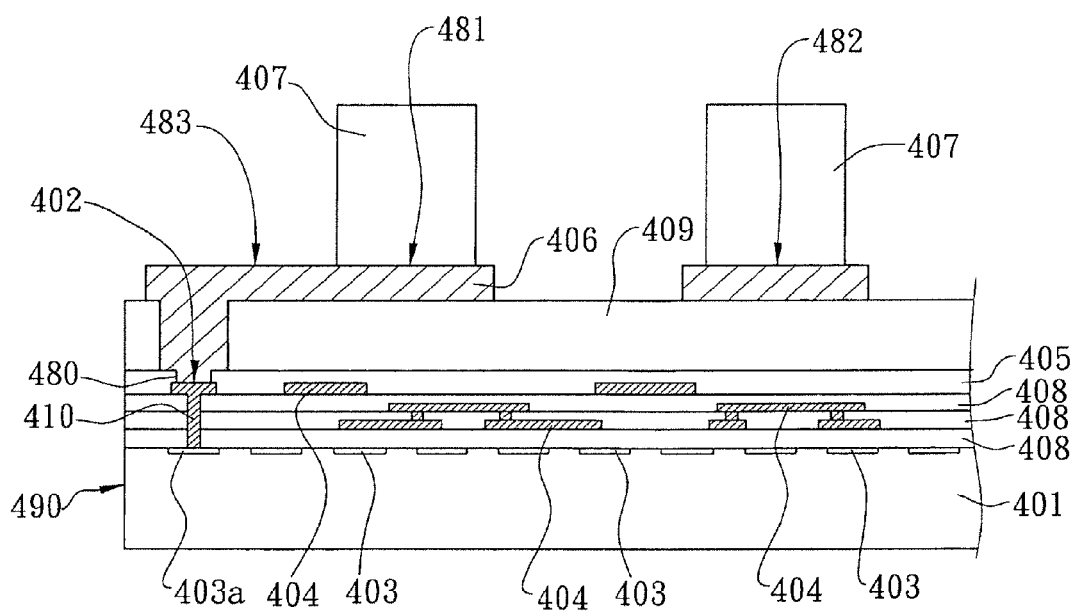
FIGS. 4B-4N illustrate cross-sectional views of alternative semiconductor chips according to the invention.

Referring to FIG. 4B, another embodiment of the invention, it is almost similar to the detail in FIG. 4A except there is a polymer layer 409 formed on the passivation layer 405 and under the patterned metal layer 406. The polymer layer 409 may be polyimide, benzocyclobutene (BCB), silicone, Teflon, paralene or rubber. Alternatively, the polymer layer 409 may be a porous structure. The polymer layer 409 may have a thickness t1 of between 1 and 30 microns, and, preferably, between 3 and 10 microns.

Figure 4C:
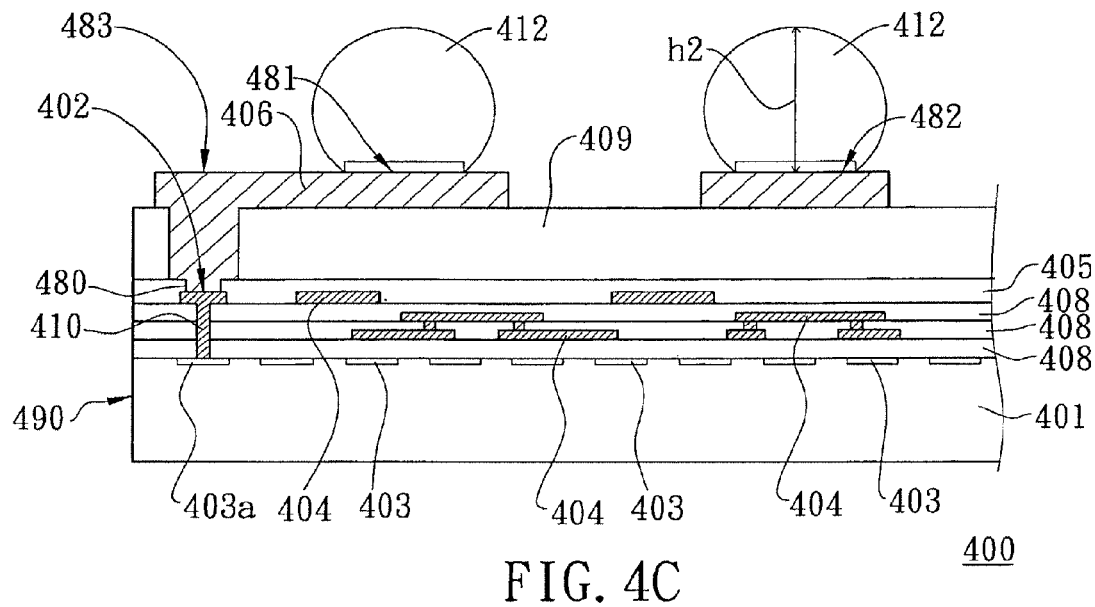

Referring to FIG. 4C, another embodiment of the invention, it is almost similar to the detail in FIGS. 4A and 4B except the following description. The contact pads 481 and 482 of the patterned metal layer 406 aligned in the external and internal lines are used to be joined with solder bumps 412 formed principally of tin-lead alloy, tin-silver alloy or tin-silver-copper alloy, for example, and have a height h2 of between 25 and 500 microns. The metal bumps 412 are used to be joined with electrical contact pads formed on a glass substrate, flexible substrate, TAB carrier, printed circuit board or another semiconductor chip. Optionally, the patterned metal layer 406 can be formed on the passivation layer 405 without the polymer layer 409 between the patterned metal layer 406 and the passivation layer 405.

Figure 4D:
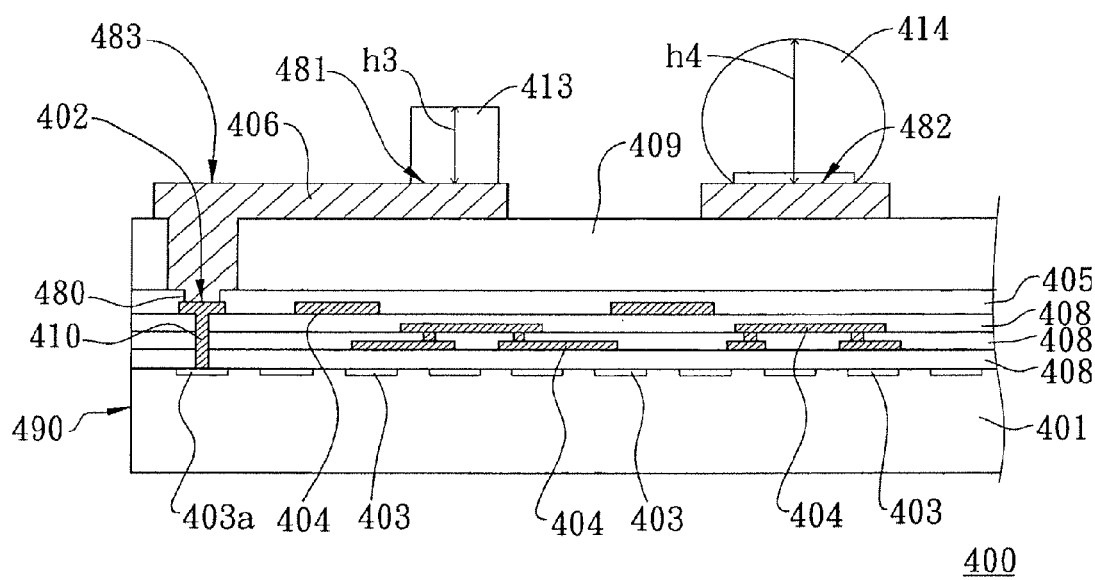

Referring to FIG. 4D, another embodiment of the invention, it is almost similar to the detail in FIGS. 4A and 4B except the following description. The contact pads 481 of the patterned metal layer 406 aligned in the external line are used to be joined with multiple metal bumps 413 formed with more than 50 percent by weight of, and preferably with more than 90 percent by weight of, gold, copper, nickel, platinum, palladium, ruthenium or rhodium, for example. The metal bumps 413 have a height h3 of between 8 and 50 microns, and preferably between 10 and 30 microns. The metal bumps 413 are used to be joined with an electrical contact formed on a glass substrate, flexible substrate, TAB carrier, printed circuit board or another semiconductor chip. The contact pads 482 of the patterned metal layer 406 aligned in the internal line are used to be joined with multiple metal bumps 414 formed principally of tin-lead alloy, tin-silver alloy or tin-silver-copper alloy, for example, and having a height h4 of between 25 and 500 microns. The metal bumps 414 are used to be joined with electrical contact pads formed on a glass substrate, flexible substrate, TAB carrier, printed circuit board or another semiconductor chip. The metal bumps 414 aligned in the internal liner are higher than the metal bumps 413 aligned in the external line, for example. Optionally, the patterned metal layer 406 can be formed on the passivation layer 405 without the polymer layer 409 between the patterned metal layer 406 and the passivation layer 405.

Figure 4E:
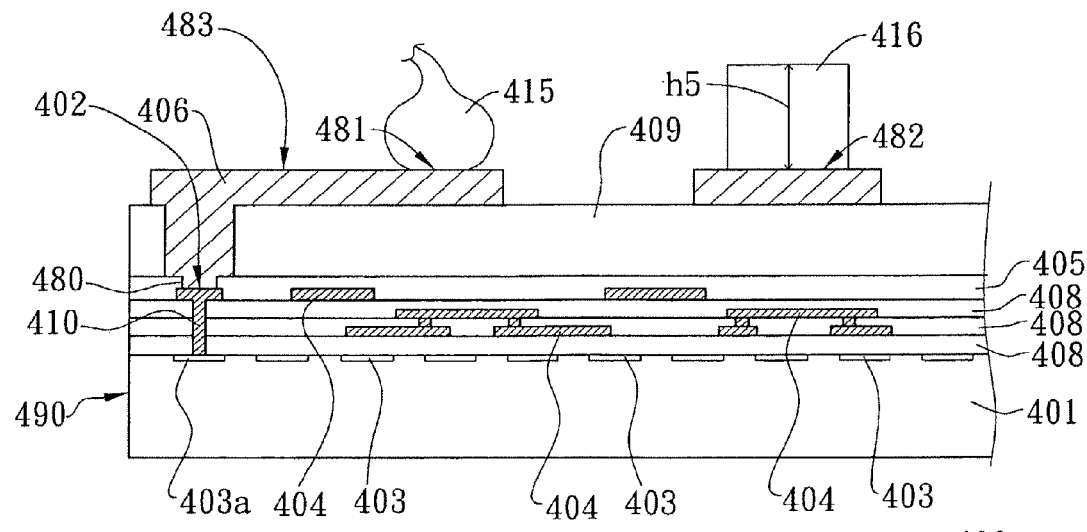

Referring to FIG. 4E, another embodiment of the invention, it is almost similar to the detail in FIGS. 4A and 4B except the following description. The contact pads 481 of the patterned metal layer 406 aligned in the external line are used to be joined with wires 415 formed by a wirebonding process. The contact pads 482 of the patterned metal layer 406 aligned in the internal line are used to be joined with multiple metal bumps 416 formed with more than 50 percent by weight of, and preferably with more than 90 percent by weight of, gold, copper, nickel, platinum, palladium, ruthenium or rhodium, for example. The metal bumps 416 have a height h5 of between 8 and 50 microns, and preferably between 10 and 30 microns. The metal bumps 416 are used to be joined with electrical contact pads formed on a glass substrate, flexible substrate, TAB carrier, printed circuit board or another semiconductor chip. Optionally, the patterned metal layer 406 can be formed on the passivation layer 405 without the polymer layer 409 between the patterned metal layer 406 and the passivation layer 405.

Figure 4F:
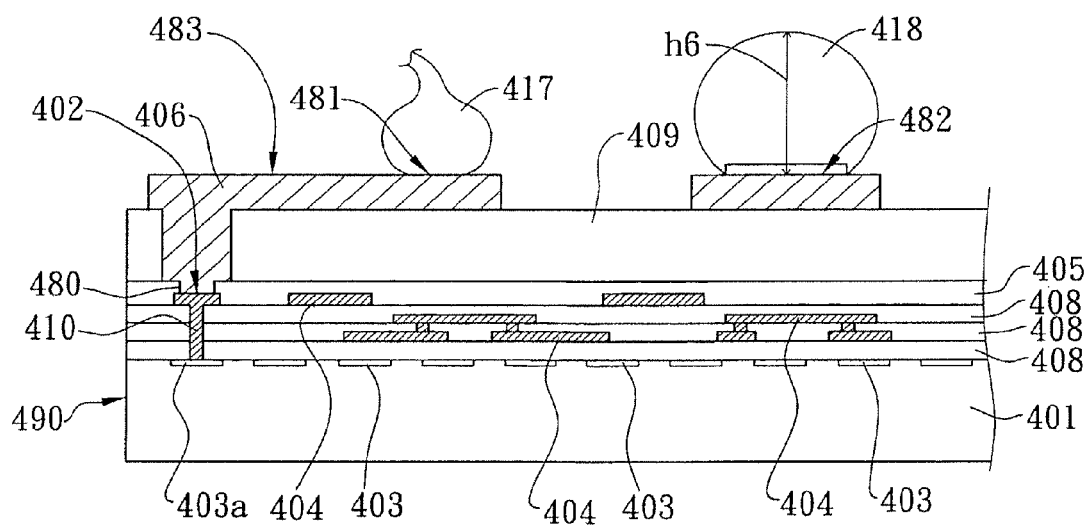

Referring to FIG. 4F, another embodiment of the invention, it is almost similar to the detail in FIGS. 4A and 4B except the following description. The contact pads 481 of the patterned metal layer 406 aligned in the external line are used to be joined with wires 417 formed by a wirebonding process. The contact pads 482 of the patterned metal layer 406 aligned in the internal line are used to be joined with multiple metal bumps 418 formed principally of tin-lead alloy, tin-silver alloy or tin-silver-copper alloy, for example, and having a height h6 of between 25 and 500 microns. The metal bumps 418 are used to be joined with multiple electrical contact pads formed on a glass substrate, flexible substrate, TAB carrier, printed circuit board or another semiconductor chip. Optionally, the patterned metal layer 406 can be formed on the passivation layer 405 without the polymer layer 409 between the patterned metal layer 406 and the passivation layer 405.

Figure 4G:
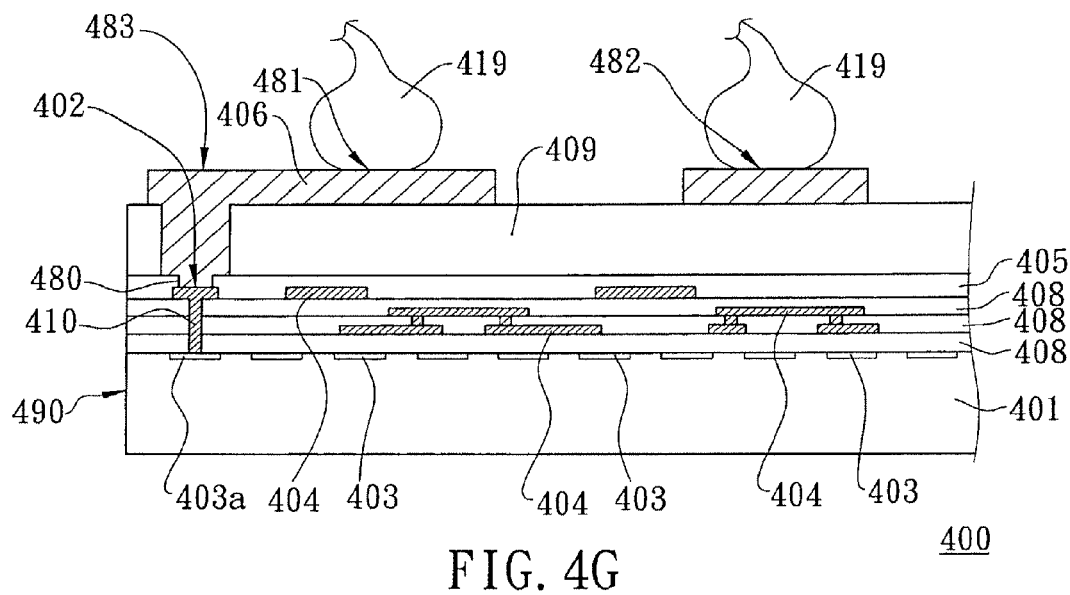

Referring to FIG. 4G, another embodiment of the invention, it is almost similar to the detail in FIGS. 4A and 4B except the following description. The contact pads 481 and 482 of the patterned metal layer 406 aligned in the external and internal lines are used to be joined with wires 419 formed by a wirebonding process. Optionally, the patterned metal layer 406 can be formed on the passivation layer 405 without the polymer layer 409 between the patterned metal layer 406 and the passivation layer 405.

Figure 4H:
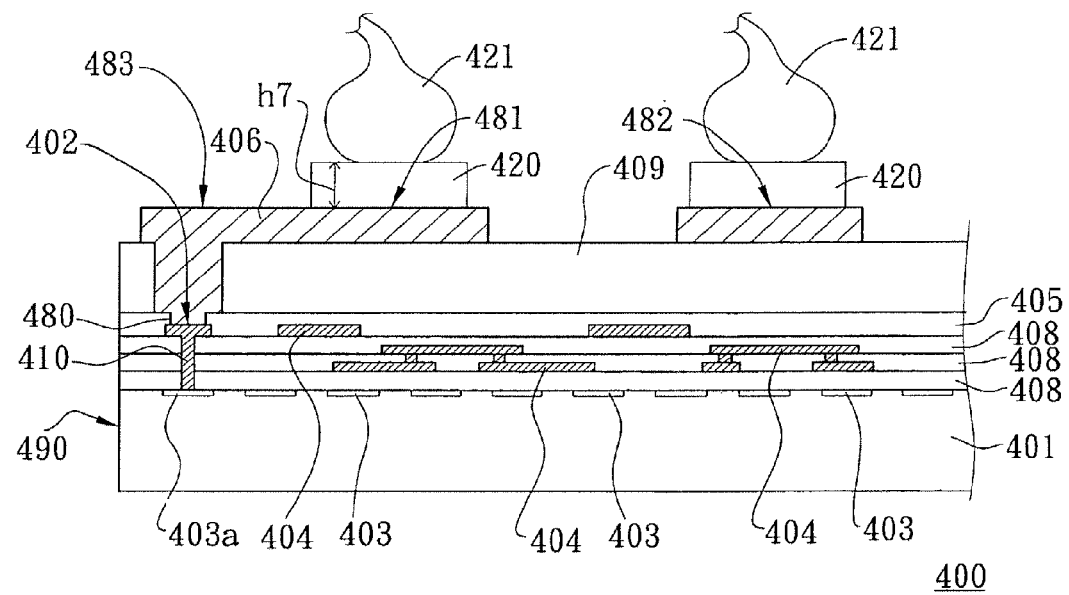

Referring to FIG. 4H, another embodiment of the invention, it is almost similar to the detail in FIGS. 4A and 4B except the following description. Metal bumps 420 are formed with more than 50 percent by weight of, and preferably with more than 90 percent by weight of, gold, copper, nickel, platinum, palladium, ruthenium or rhodium, for example. The metal bumps 420 have a height h7 of between 1 and 20 microns, and preferably between 1 and 10 microns. The metal bumps 420 are deposited on the contact pads 481 and 482 of the patterned metal layer 406 aligned in the external and internal lines. The metal bumps 420 are used to be joined with wires 421 formed by a wirebonding process. Optionally, the patterned metal layer 406 can be formed on the passivation layer 405 without the polymer layer 409 between the patterned metal layer 406 and the passivation layer 405.

Figure 4I:
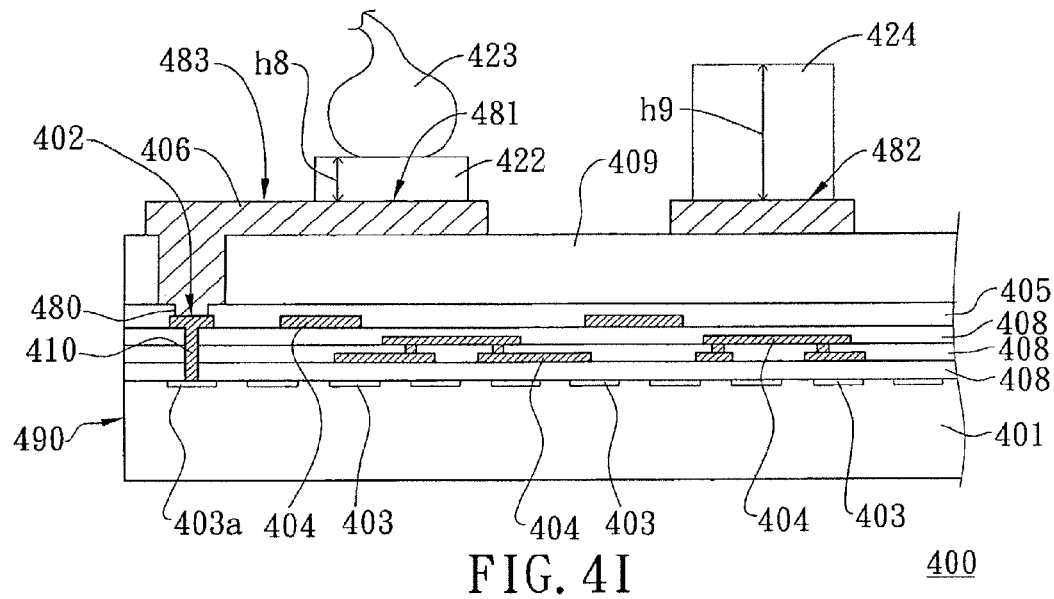

Referring to FIG. 4I, another embodiment of the invention, it is almost similar to the detail in FIGS. 4A and 4B except the following description. Metal bumps 422 are formed with more than 50 percent by weight of, and preferably with more than 90 percent by weight of, gold, copper, nickel, platinum, palladium, ruthenium or rhodium, for example. The metal bumps 422 have a height h8 of between 1 and 20 microns, and preferably between 1 and 10 microns. The metal bumps 422 are deposited on the contact pads 481 of the patterned metal layer 406 aligned in the external line. The metal bumps 422 are used to be joined with wires 423 formed by a wirebonding process. Metal bumps 424 are formed with more than 50 percent by weight of, and preferably with more than 90 percent by weight of, gold, copper, nickel, platinum, palladium, ruthenium or rhodium, for example. The metal bumps 424 have a thickness h9 of between 8 and 50 microns, and preferably between 10 and 30 microns. The metal bumps 424 are deposited on the contact pads 482 of the patterned metal layer 406 aligned in the internal line. The metal bumps 424 are used to be joined with electrical contact pads formed on a glass substrate, flexible substrate, TAB carrier, printed circuit board or another semiconductor chip. Optionally, the patterned metal layer 406 can be formed on the passivation layer 405 without the polymer layer 409 between the patterned metal layer 406 and the passivation layer 405.

Figure 4J:
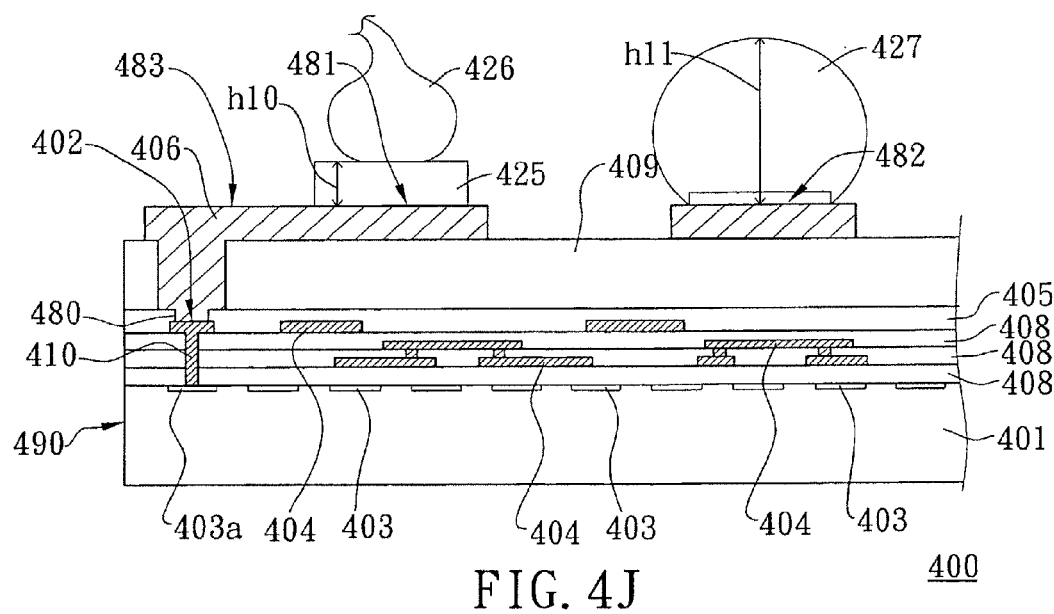

Referring to FIG. 4J, another embodiment of the invention, it is almost similar to the detail in FIGS. 4A and 4B except the following description. Metal bumps 425 are formed with more than 50 percent by weight of, and preferably with more than 90 percent by weight of, gold, copper, nickel, platinum, palladium, ruthenium or rhodium, for example. The metal bumps 425 have a height h10 of between 1 and 20 microns, and preferably between 1 and 10 microns. The metal bumps 425 are deposited on the contact pads 481 of the patterned metal layer 406 aligned in the external line. The metal bumps 425 are used to be joined with wires 426 formed by a wirebonding process. Metal bumps 427 formed principally of tin-lead alloy, tin-silver alloy or tin-silver-copper alloy, for example, and having a thickness h11 of between 25 and 500 microns are deposited on the contact pads 482 of the patterned metal layer 406 aligned in the internal line. The metal bumps 427 are used to be joined with electrical contact pads formed on a glass substrate, flexible substrate, TAB carrier, printed circuit board or another semiconductor chip. Optionally, the patterned metal layer 406 can be formed on the passivation layer 405 without the polymer layer 409 between the patterned metal layer 406 and the passivation layer 405.

Figure 4K:
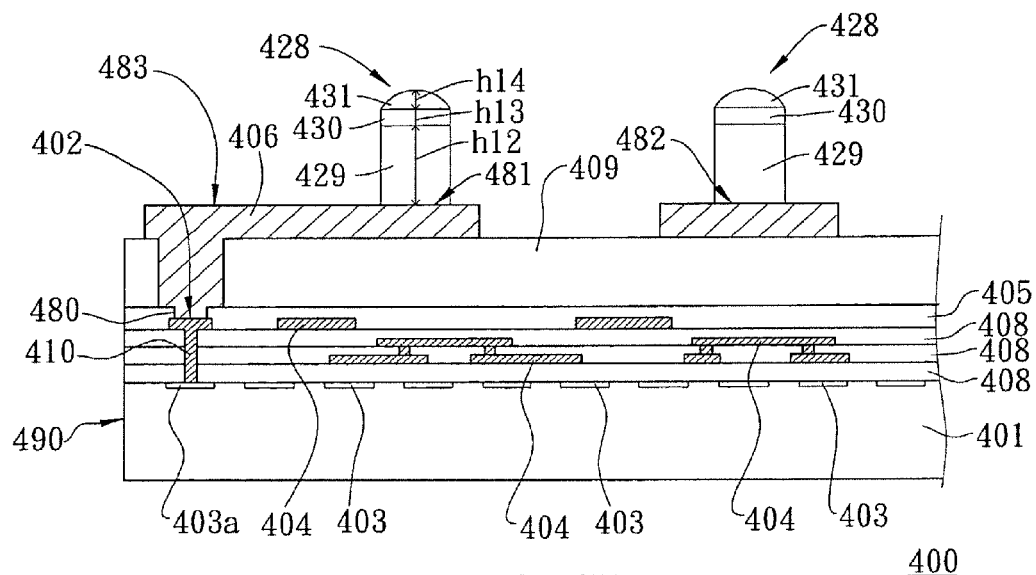

Referring to FIG. 4K, another embodiment of the invention, it is almost similar to the detail in FIGS. 4A and 4B except the following description. Metal bumps 428 each including a metal post 429, a diffusion-barrier layer 430 on the metal post 429, and a solder cap 431 on the diffusion-barrier layer 430 are deposited on the contact pads 481 and 482 of the patterned metal layer 406 aligned in the external and internal lines. The metal post 429 is formed with more than 50 percent by weight of, and preferably with more than 90 percent by weight of, gold, copper, nickel, platinum, palladium, ruthenium or rhodium, for example, and has a height h12 of between 5 and 250 microns, and preferably between 50 and 100 microns. The diffusion-barrier layer 430 is formed with more than 50 percent by weight of, and preferably with more than 90 percent by weight of, nickel, for example, and has a height h13 of between 0.5 and 10 microns. The metal cap 431 is formed principally of tin-lead alloy, tin-silver-copper alloy or tin-silver alloy, for example, and has a height h14 of between 10 and 200 microns. The metal bumps 428 are used to be joined with electrical contact pads formed on a glass substrate, flexible substrate, TAB carrier, printed circuit board or another semiconductor chip. Optionally, the patterned metal layer 406 can be formed on the passivation layer 405 without the polymer layer 409 between the patterned metal layer 406 and the passivation layer 405.

Figure 4L:
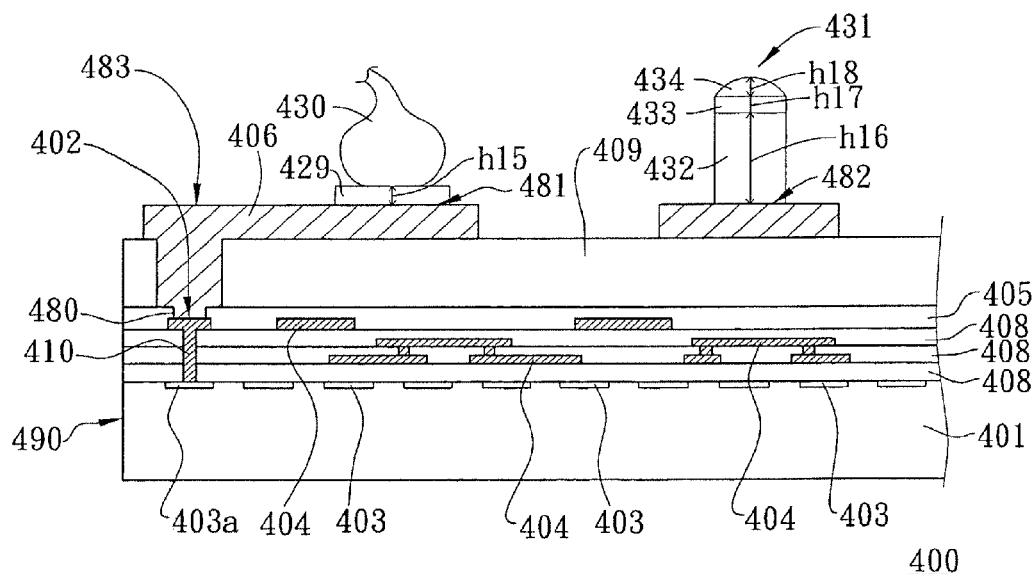

Referring to FIG. 4L, another embodiment of the invention, it is almost similar to the detail in FIGS. 4A and 4B except the following description. Metal bumps 429 are formed with more than 50 percent by weight of, and preferably with more than 90 percent by weight of, gold, copper, nickel, platinum, palladium, ruthenium or rhodium, for example. The metal bumps 429 have a height h15 of between 1 and 20 microns, and preferably between 1 and 10 microns. The metal bumps 429 are deposited on the contact pads 481 of the patterned metal layer 406 aligned in the external line. The metal bumps 429 are used to be joined with wires 430 formed by a wirebonding process. Metal bumps 431 each including a metal post 432, a diffusion-barrier layer 433 on the metal post 432, and a solder cap 434 on the diffusion-barrier layer 433 are deposited on the contact pads 482 of the patterned metal layer 406 aligned in the internal line. The metal post 432 is formed with more than 50 percent by weight of, and preferably with more than 90 percent by weight of, gold, copper, nickel, platinum, palladium, ruthenium or rhodium, for example, and has a height h16 of between 5 and 250 microns, preferably between 50 and 100 microns. The diffusion-barrier layer 433 is formed with more than 50 percent by weight of, and preferably with more than 90 percent by weight of, nickel, for example, and has a height h17 of between 0.5 and 10 microns. The metal cap 434 is formed principally of tin-lead alloy, tin-silver-copper alloy or tin-silver alloy, for example, and has a height h18 of between 10 and 200 microns. The metal bumps 431 are used to be joined with electrical contact pads formed on a glass substrate, flexible substrate, TAB carrier, printed circuit board or another semiconductor chip. Optionally, the patterned metal layer 406 can be formed on the passivation layer 405 without the polymer layer 409 between the patterned metal layer 406 and the passivation layer 405.

Figure 4M:
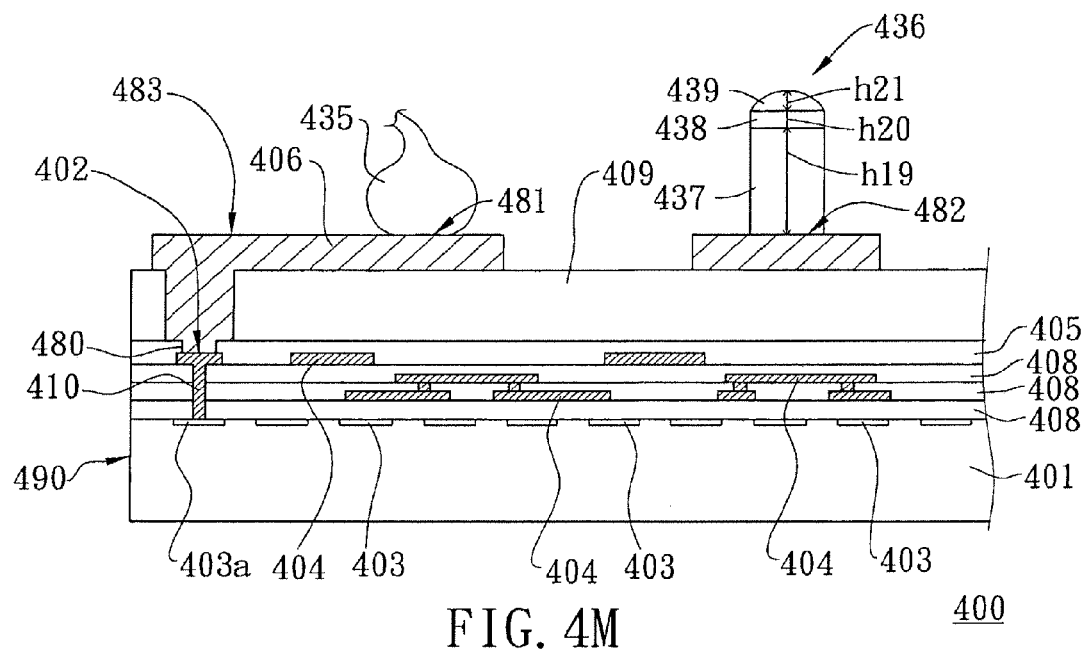

Referring to FIG. 4M, another embodiment of the invention, it is almost similar to the detail in FIGS. 4A and 4B except the following description. The contact pads 481 of the patterned metal layer 406 aligned in the external line are used to be joined with wires 435 formed by a wirebonding process. Metal bumps 436 each including a metal post 437, a diffusion-barrier layer 438 on the metal post 437, and a solder cap 439 on the diffusion-barrier layer 438 are deposited on the contact pads 482 of the patterned metal layer 406 aligned in the internal lines. The metal post 437 is formed with more than 50 percent by weight of, and preferably with more than 90 percent by weight of, gold, copper, nickel, platinum, palladium, ruthenium or rhodium, for example, and has a height h19 of between 5 and 250 microns, preferably between 50 and 100 microns. The diffusion-barrier layer 438 is formed with more than 50 percent by weight of, and preferably with more than 90 percent by weight of, nickel, for example, and has a height h20 of between 0.5 and 10 microns. The metal cap 439 is formed principally of tin-lead alloy, tin-silver-copper alloy or tin-silver alloy, for example, and has a height h21 of between 10 and 200 microns. The metal bumps 436 are used to be joined with electrical contact pads formed on a glass substrate, flexible substrate, TAB carrier, printed circuit board or another semiconductor chip. Optionally, the patterned metal layer 406 can be formed on the passivation layer 405 without the polymer layer 409 between the patterned metal layer 406 and the passivation layer 405.

Figure 4N:
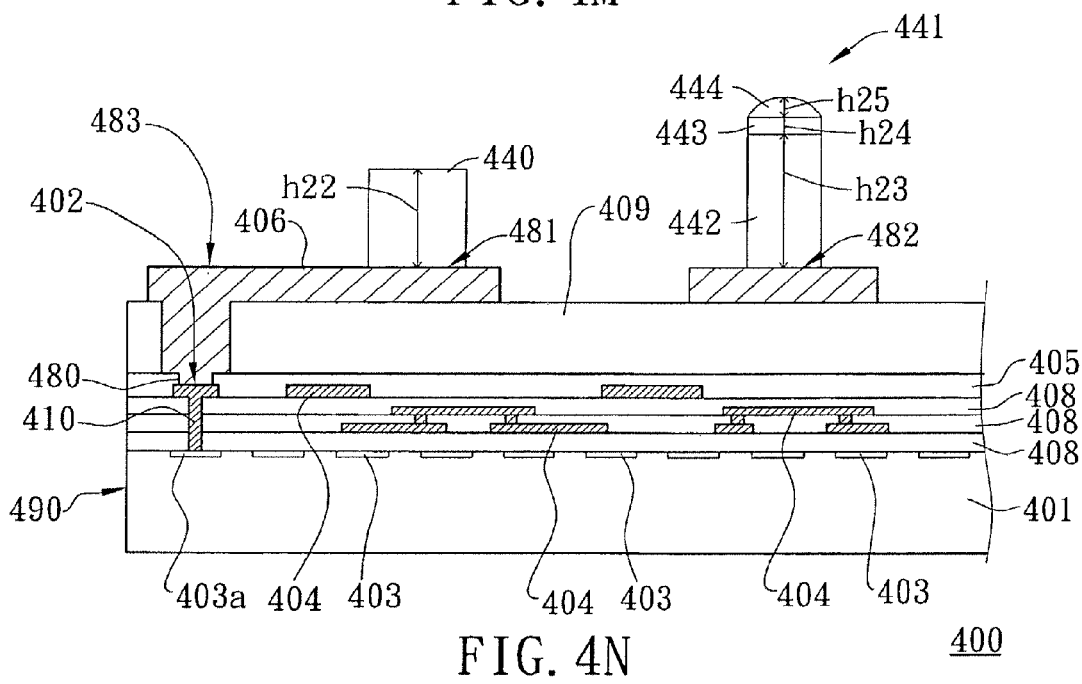

Referring to FIG. 4N, another embodiment of the invention, it is almost similar to the detail in FIGS. 4A and 4B except the following description. Metal bumps 440 are formed with more than 50 percent by weight of, and preferably with more than 90 percent by weight of, gold, copper, nickel, platinum, palladium, ruthenium or rhodium, for example. The metal bumps 440 have a height h22 of between 8 and 50 microns, and preferably between 10 and 30 microns. The metal bumps 440 are deposited on the contact pads 481 of the patterned metal layer 406 aligned in the external line. The metal bumps 440 are used to be joined with electrical contact pads formed on a glass substrate, flexible substrate, TAB carrier, printed circuit board or another semiconductor chip. Metal bumps 441 each including a metal post 442, a diffusion-barrier layer 443 on the metal post 442, and a solder cap 444 on the diffusion-barrier layer 443 are deposited on the contact pads 482 of the patterned metal layer 406 aligned in the internal line. The metal post 442 is formed with more than 50 percent by weight of, and preferably with more than 90 percent by weight of, gold, copper, nickel, platinum, palladium, ruthenium or rhodium, for example, and has a height h23 of between 5 and 250 microns, preferably between 50 and 100 microns. The diffusion-barrier layer 443 is formed with more than 50 percent by weight of, and preferably with more than 90 percent by weight of, nickel, for example, and has a height h24 of between 0.5 and 10 microns. The metal cap 444 is formed principally of tin-lead alloy, tin-silver-copper alloy or tin-silver alloy, for example, and has a height h25 of between 10 and 200 microns. The metal bumps 441 are used to be joined with electrical contact pads formed on a glass substrate, flexible substrate, TAB carrier, printed circuit board or another semiconductor chip. Optionally, the patterned metal layer 406 can be formed on the passivation layer 405 without the polymer layer 409 between the patterned metal layer 406 and the passivation layer 405.

Figure 5A:
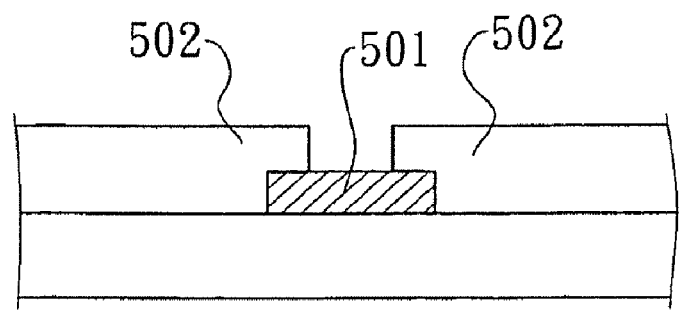
FIGS. 5A-5F illustrate cross-sectional views of forming an RDL layer and metal bump according to the invention.

FIGS. 5A-5F illustrate a process for forming the above-mentioned RDL layer and metal bumps in accordance with the invention. Referring to FIG. 5A, a semiconductor wafer 500 includes a semiconductor substrate, multiple thin-film dielectric layers, multiple thin-film metal layers and a passivation layer 502, whose detail structures can be as referred to the embodiment shown in FIG. 4A. The topmost one of the thin-film metal layers includes a contact pad 501 exposed by an opening in the passivation layer 502. In another embodiment, there can be a polymer layer (not shown) formed to improve the planerization and buffer the stress, which can be as referred to FIG. 4b. The polymer layer, such as polyimide, is on the passivation layer 502, and an opening in the polymer exposes the contact pad 501. The preferred thickness of the polymer ranges from 1 μm to 30 μm.

Figure 5B:
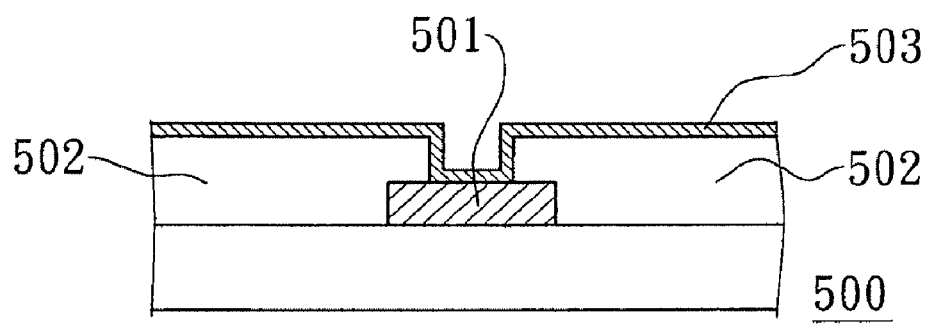

Next, referring to FIG. 5B, an adhesion/barrier layer 503 is formed, such as by sputtering or evaporating, to cover the contact pad 501 and the passivation layer. The material for adhesion/barrier layer 503 may be Ti, Cr, or TiW. Then a seed layer (not shown) is formed on the adhesion/barrier layer 503. Sputtering, electroplating, or electro-less plating may be employed to form the seed layer.

Figure 5C:
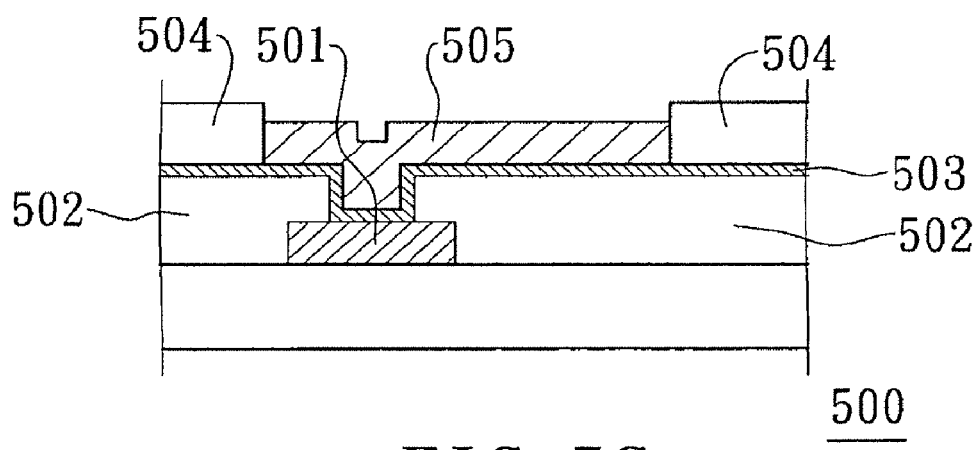

Then referring to FIG. 5C, forming a photoresist (PR) layer 504 is employed to define the pattern of the RDL layer 505. The photoresist (PR) layer 504 may have a thickness of between 1 microns and 50 microns, and preferably between 3 microns and 15 microns. A layer 505 of Au or Cu having a thickness of between 1 and 10 microns is preferred to fill the openings in the PR layer 504 using an electroplating or electroless plating process. If a layer of Cu is employed, optionally, another layer of Ni may be electroplated or electroless plated on the Cu layer to prevent the Cu layer from oxidizing.

Figure 5D:
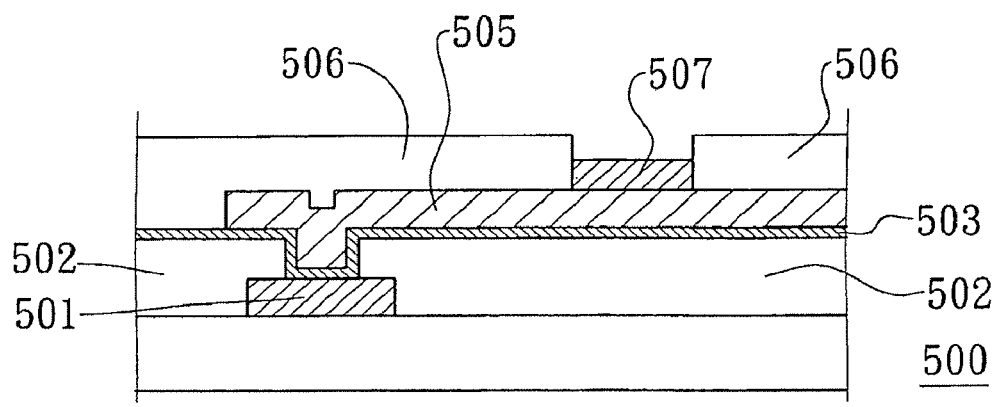

Now referring to FIG. 5D, the PR layer 504 is removed, and then another PR layer 506 is deposited on the metal layer 505, an opening in the PR layer 506 exposing the underlying metal layer 505. Next, one or more metal layers composing a metal bump are deposited on the underlying metal layer 505 exposed by the opening in the PR layer 506 using an electroplating or electroless plating process.

In an embodiment for forming a metal bump, an adhesion/barrier layer, such as copper, nickel, gold, titanium, chromium or titanium-tungsten alloy, can be optionally formed on the metal layer 505 exposed by the opening in the PR layer 506 using an electroplating or electroless-plating process. Next, a metal layer having more than 95 percent by weight of gold, copper, nickel, platinum, palladium, ruthenium or rhodium, for example, and having a height of between 1 and 50 microns is formed optionally on the adhesion/barrier layer or on the metal layer 505 exposed by the opening in the PR layer 506 using an electroplating or electroless-plating process. The metal bump can be used to be wirebonded thereto or to be connected to an electrical contact formed on a glass substrate, flexible substrate, TAB carrier, printed circuit board or another semiconductor chip.

In another embodiment for forming a metal bump, an adhesion/barrier layer, such as copper, nickel, gold, titanium, chromium or titanium-tungsten alloy, can be optionally formed on the metal layer 505 exposed by the opening in the PR layer 506 using an electroplating or electroless-plating process. Preferably, the adhesion/barrier layer is formed by depositing a copper layer with more than 95 percent by weight of copper on the metal layer 505 using an electroplating or electroless-plating process, and then depositing a nickel layer with more than 95 percent by weight of nickel on the copper layer using an electroplating or electroless-plating process. Next, a solder layer, such as tin-lead alloy, tin-silver alloy or tin-silver-copper alloy, having a thickness of between 25 and 500 microns is formed optionally on the adhesion/barrier layer, and preferably on the nickel layer of the adhesion/barrier layer, or on the metal layer 505 using an electroplating or electroless-plating process. The metal bump can be used to be connected to an electrical contact formed on a glass substrate, flexible substrate, TAB carrier, printed circuit board or another semiconductor chip.

In another embodiment for forming a metal bump, an adhesion/barrier layer, such as copper, nickel, gold, titanium, chromium or titanium-tungsten alloy, can be optionally formed on the metal layer 505 exposed by the opening in the PR layer 506 using an electroplating or electroless-plating process. Next, for forming a metal post, a layer of gold, copper, nickel, platinum, palladium, ruthenium or rhodium, for example, having a height of between 5 and 250 microns, and preferably between 50 and 100 microns, is formed optionally on the adhesion/barrier layer or on the metal layer 505 exposed by the opening in the PR layer 506 using an electroplating or electroless-plating process. Preferably, the metal post is formed principally of copper, that is, the metal post has more than 95 percent by weight of copper. Next, for forming a diffusion-barrier layer, a nickel layer having more than 95 percent by weight of nickel and having a height of between 0.5 and 10 microns is formed on the metal post using an electroplating or electroless-plating process. Next, for forming a solder cap, a solder layer, such as tin-lead alloy, tin-silver alloy, or tin-silver-copper alloy, having a height of between 10 and 200 microns is formed on the diffusion-barrier layer using an electroplating or electroless-plating process. The metal bump can be used to be connected to an electrical contact formed on a glass substrate, flexible substrate, TAB carrier, printed circuit board or another semiconductor chip.

Figure 5E:
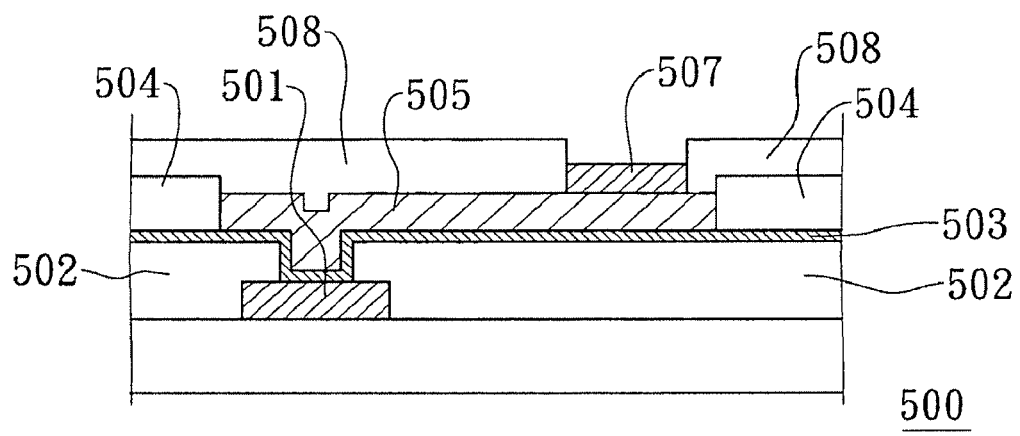
Figure 5F:
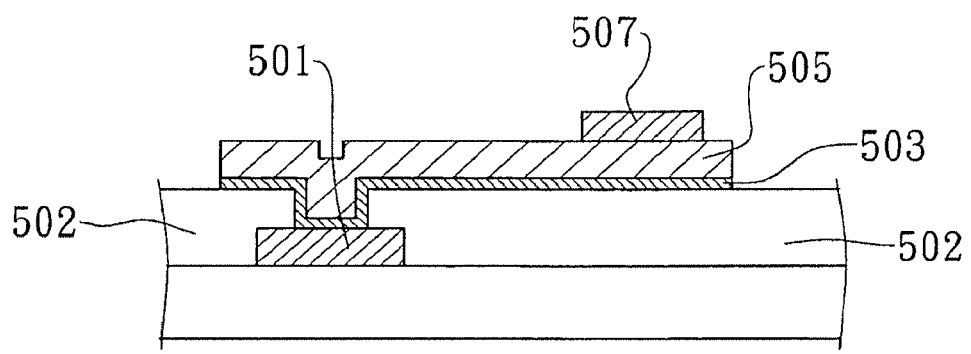

Referring to FIG. 5F, after forming the metal bump 507, the PR layer 506 is removed. Thereafter, the seed layer and the adhesion/barrier layer 503 not under the metal layer 505 are removed using an etching process. Next, if the metal bumps comprise solder, a reflow process is performed.

FIG. 5E illustrates the alternate way to form the above-mentioned patterned metal layer and metal bump. The difference between FIG. 5E and FIG. 5D is that the PR layer 504 for defining the pattern of the metal layer 505 is not removed. The later-formed PR layer 508 is formed on the PR layer 504 and the RDL layer 505. An opening in the PR layer 508 exposes the RDL layer 505 for defining the pattern of the later-formed metal bump 507. The process for depositing the metal bump 507 can be as referred to the above disclosure. Finally, referring to FIG. 5F, the PR layers 508 and 504 are removed. Thereafter, the seed layer and adhesion/barrier layer not under the metal layer 505 are removed using an etching process. Next, if the metal bumps comprise solder, a reflow process is performed.

Figure 6:
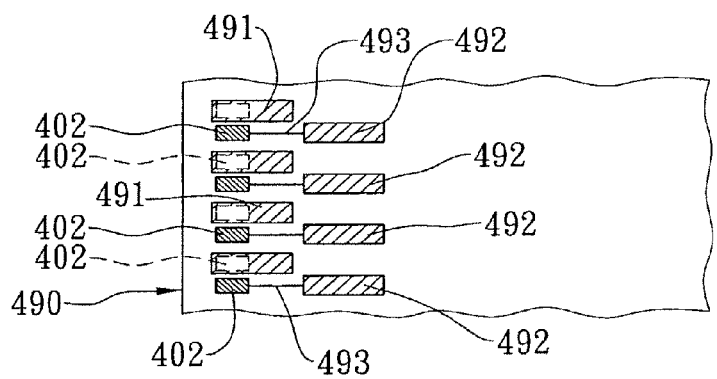
FIGS. 6-6A illustrate top and cross-sectional views of an alternative semiconductor chip according to the invention.
Figure 6A:
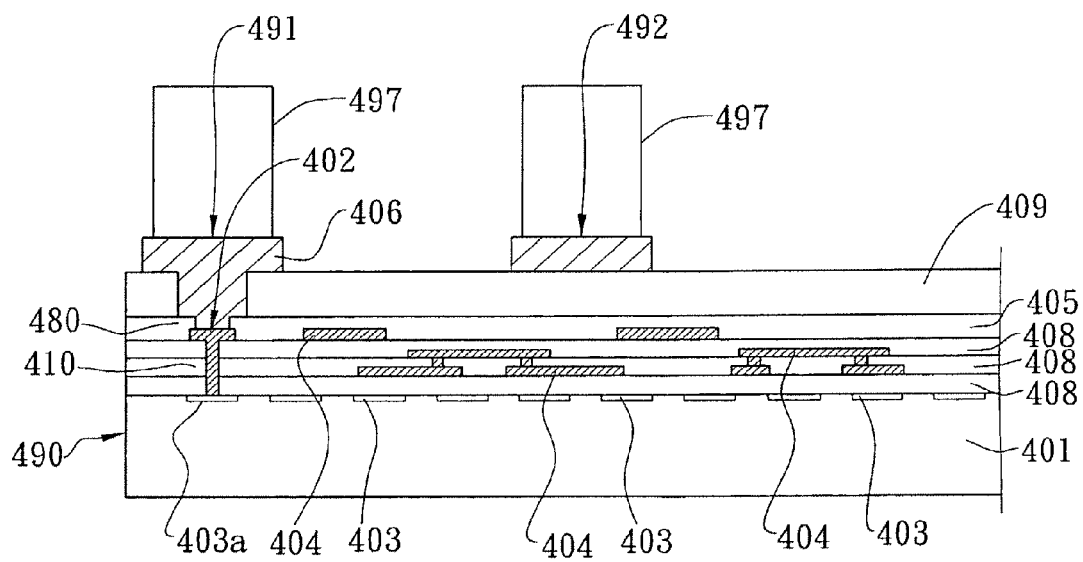

FIGS. 6 and 6A are an embodiment of the invention to show top and cross-sectional views of a semiconductor chip. The contact pads 402 are placed close to the edge 490 of the semiconductor chip 400. A patterned metal layer 406 including multiple contact pads 491 and 492 and traces 493 is formed on the polymer layer 409 and on the contact pads 402 exposed by openings in the passivation layer 405. The contact pads 491 aligned in the external line are placed on the contact pads 402 exposed by the openings in the passivation layer 405, while the contact pads 492 aligned in the internal line are placed not on the contact pads 402 exposed by the openings in the passivation layer 405 but on the polymer layer 409. The traces 493 of the patterned metal layer connect the contact pads 402 exposed by the openings in the passivation layer 405 to the contact pads 492 aligned in the internal line. Various metal bumps described in the above paragraphs can be formed on the contact pads 491 and 492. Wires formed by a wirebonding process can also be connected to the contact pads 491 and 492. The combinations for depositing the above-mentioned various metal bumps or wires formed by a wirebonding process on the contact pads 491 and 492 aligned in the external or internal lines can be as referred to FIGS. 4A-4N. The process for forming the patterned metal layer 406 and the metal bumps 497 can be as referred to FIGS. 5A-5F. Optionally, the patterned metal layer 406 can be formed on the passivation layer 405 without the polymer layer 409 between the patterned metal layer 406 and the passivation layer 405.

Figure 7:
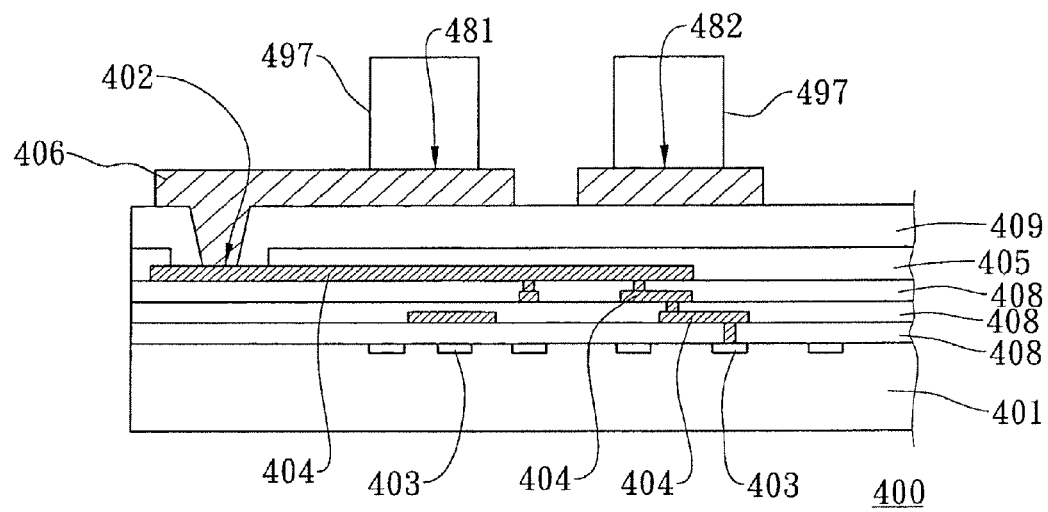
FIGS. 7-9 illustrate cross-sectional views of alternative semiconductor chips according to the invention.
Figure 8:
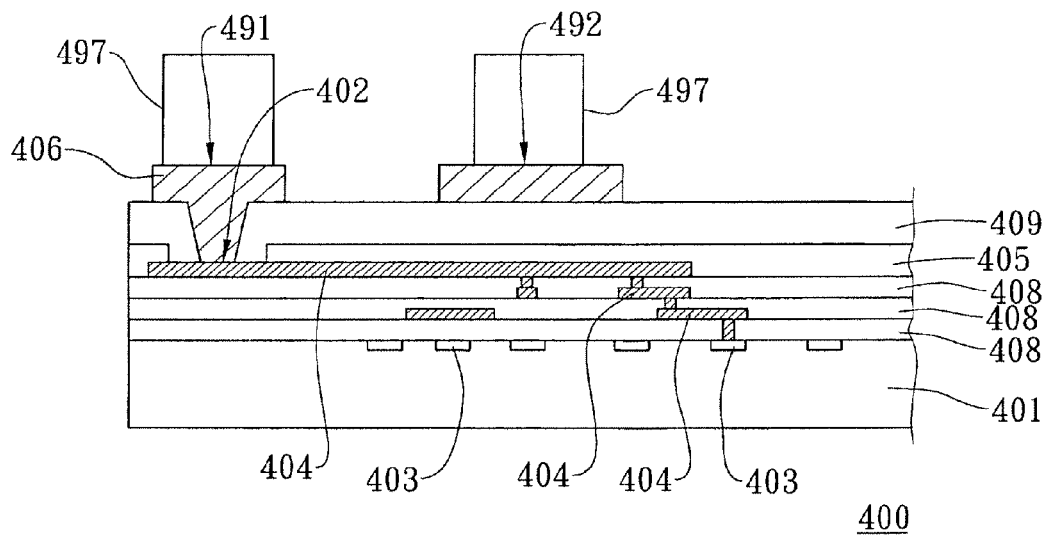

FIGS. 7 and 8 are an embodiment of the invention to show cross-sectional views of semiconductor chips. The elements shown in FIGS. 7 and 8 can be as referred to those shown in FIGS. 4A and 4B with same reference numbers. The difference from the above embodiments is that the contact pad 402 exposed by the opening in the passivation layer 405 is over a peripheral region of the semiconductor substrate 401 having no semiconductor devices 402, such as CMOS devices, transistors, capacitors, resistors or inductors. A polymer layer 409 is formed on the passivation layer 405 and on the contact pad 402 exposed by the openings in the passivation layer 405, an opening in the polymer layer 409 exposing the contact pad 402 exposed by the opening in the passivation layer 405.

In FIG. 7, the contact pads 481 and 482 used to be wirebonded thereto or have metal bumps 497 formed thereon are formed over the semiconductor devices 403 and not over the contact pads 402. The top view of FIG. 7 can be as referred to FIG. 4. The combinations for depositing the above-mentioned various metal bumps 497 or wires formed by a wirebonding process on the contact pads 481 and 482 aligned in the external and internal lines can be as referred to FIGS. 4A-4N. The process for forming the patterned metal layer 406 and the metal bumps 497 can be as referred to FIGS. 5A-5F. Optionally, the patterned metal layer 406 can be formed on the passivation layer 405 without the polymer layer 409 between the patterned metal layer 406 and the passivation layer 405.

In FIG. 8, the contact pads 491 used to be wirebonded thereto or have metal bumps 497 formed thereon, aligned in the external line, are formed over the contact pads and not over the semiconductor devices 403. The contact pads 492 used to be wirebonded thereto or have metal bumps 497 formed thereon, aligned in the internal line, are formed on the polymer layer 409 and over the semiconductor devices 403. The top view of FIG. 8 can be as referred to FIG. 6. The combinations for depositing the above-mentioned various metal bumps or wires formed by a wirebonding process on the contact pads 491 and 492 aligned in the external or internal lines can be as referred to FIGS. 4A-4N. The process for forming the patterned metal layer 406 and the metal bumps 497 can be as referred to FIGS. 5A-5F. Optionally, the patterned metal layer 406 can be formed on the passivation layer 405 without the polymer layer 409 between the patterned metal layer 406 and the passivation layer 405.

Figure 9:
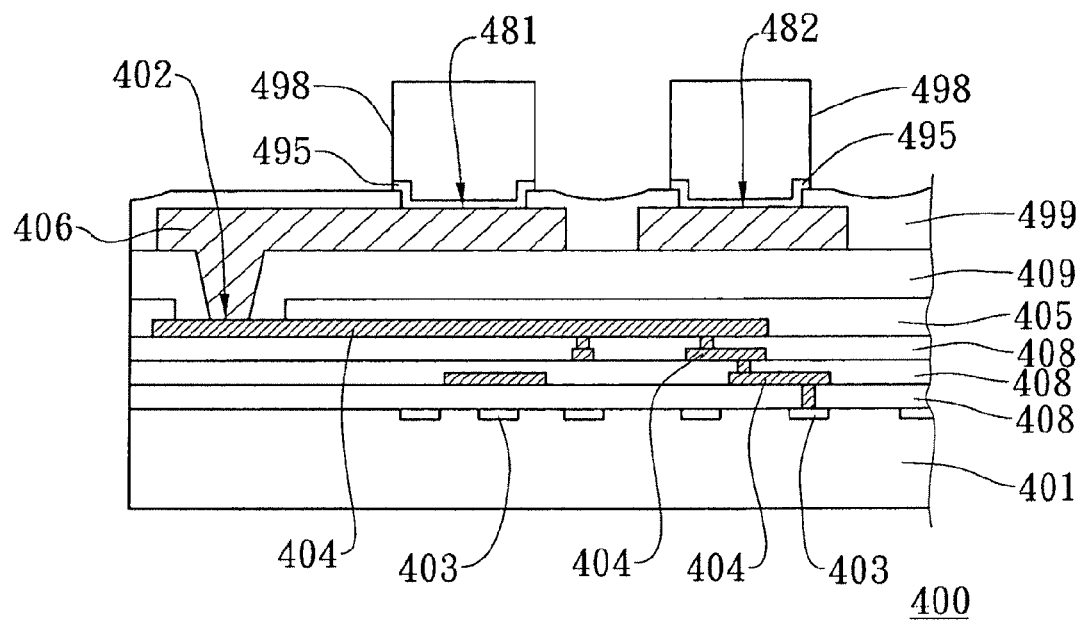

FIG. 9 is an embodiment of the invention to show a cross-sectional view of a semiconductor chip. For protecting the patterned metal layer 406, a polymer layer 499 can be deposited on the patterned metal layer 406, multiple openings in the polymer layer 499 exposing multiple contact pads 481 and 482 of the patterned metal layer 406. The top view of FIG. 9 can be as referred to FIG. 4. Alternatively, some of the contact pads of the RDL layer 406 can be formed over the contact pads 402 exposed by the openings in the passivation layer 405, the top view of which can be as referred to FIG. 6. After forming the polymer layer 409, multiple metal bumps 497 or wirebonded wires are deposited on the contact pads 481 and 482. The combinations for depositing the above-mentioned various metal bumps or wires formed by a wirebonding process on the contact pads 481 and 482 aligned in the external or internal lines can be as referred to FIGS. 4A-4N. Optionally, the patterned metal layer 406 can be formed on the passivation layer 405 without the polymer layer 409 between the patterned metal layer 406 and the passivation layer 405. The difference of the various metal bumps employed in the embodiment from those employed in FIGS. 4A-4N is that an adhesion/barrier layer 495 and a seed layer (not shown) are further formed on the contact pads 481 and 482 using a sputtering, evaporating or electroless plating process, as described below.

In an embodiment for forming metal bumps on the contact pads 481 and 482 with the polymer layer 499 formed on the patterned metal layer 406 as shown in FIG. 9, an adhesion/barrier layer 495, such as copper, nickel, gold, titanium, chromium or titanium-tungsten alloy, is formed on the polymer layer 499 and the contact pads 481 and 482 using a sputtering, evaporating or electroless-plating process. Next, a seed layer, such as gold, copper, nickel, platinum, palladium, ruthenium or rhodium, is formed on the adhesion/barrier layer using a sputtering, evaporating or electroless-plating process. Next, a PR layer is formed on the seed layer, multiple openings in the PR layer exposing the seed layer. Next, a bulk layer 498 having more than 95 percent by weight of gold, copper, nickel, platinum, palladium, ruthenium or rhodium, for example, and having a height of between 1 and 50 microns is formed on the seed layer exposed by the opening in the PR layer using an electroplating or electroless-plating process. Next, the PR layer is removed. Next, the seed layer and adhesion/barrier layer 495 not under the bulk layer 498 are removed. The metal bumps can be used to be wirebonded thereto or to be connected to electrical contact pads formed on a glass substrate, flexible substrate, TAB carrier, printed circuit board or another semiconductor chip.

In another embodiment for forming metal bumps on the contact pads 481 and 482 with the polymer layer 499 formed on the patterned metal layer 406 as shown in FIG. 9, an adhesion/barrier layer, such as copper, nickel, gold, titanium, chromium or titanium-tungsten alloy, is formed on the polymer layer and the contact pads using a sputtering, evaporating or electroless-plating process. Next, a seed layer, such as copper, is formed on the adhesion layer using a sputtering, evaporating or electroless-plating process. Next, a PR layer is formed on the seed layer, multiple openings in the PR layer exposing the seed layer. Next, a copper layer with more than 95 percent by weight of copper and with a thickness of between 0.5 and 10 microns is formed on the seed layer exposed by the openings in the PR layer using an electroplating or electroless-plating process. Next, a nickel layer with more than 95 percent by weight of nickel and with a thickness of between 0.5 and 10 microns is formed on the copper layer exposed by the openings in the PR layer using an electroplating or electroless-plating process. Next, a solder layer, such as tin-lead alloy, tin-silver alloy or tin-silver-copper alloy, having a thickness of between 25 and 500 microns is formed optionally on the nickel layer using an electroplating or electroless-plating process. Next, the PR layer is removed. Next, the seed layer and adhesion/barrier layer not under the solder layer are removed. Next, a reflow process is performed. The metal bumps can be used to be connected to the electrical contact pads formed on a glass substrate, flexible substrate, TAB carrier, printed circuit board or another semiconductor chip.

In another embodiment for forming metal bumps on the contact pads 481 and 482 with the polymer layer 499 formed on the patterned metal layer 406 as shown in FIG. 9, an adhesion/barrier layer, such as copper, nickel, gold, titanium, chromium or titanium-tungsten alloy, is formed on the polymer layer and the contact pads using a sputtering, evaporating or electroless-plating process. Next, a seed layer, such as gold, copper, nickel, platinum, palladium, ruthenium or rhodium, is formed on the adhesion layer using a sputtering, evaporating or electroless-plating process. Next, a PR layer is formed on the seed layer, multiple openings in the PR layer exposing the seed layer. Next, for forming metal posts, a layer of gold, copper, nickel, platinum, palladium, ruthenium or rhodium, for example, having a height of between 5 and 250 microns, and preferably between 50 and 100 microns, is formed on the seed layer exposed by the openings in the PR layer using an electroplating or electroless-plating process. Preferably, the metal posts are formed principally of copper, that is, the metal posts have more than 95 percent by weight of copper. Next, for forming a diffusion-barrier layer, a nickel layer having more than 95 percent by weight of nickel and having a height of between 0.5 and 10 microns is formed on the metal post exposed by the openings in the PR layer using an electroplating or electroless-plating process. Next, for forming solder caps, a solder layer, such as tin-lead alloy, tin-silver alloy, or tin-silver-copper alloy, having a height of between 10 and 200 microns is formed on the diffusion-barrier layer exposed by the openings in the PR layer using an electroplating or electroless-plating process. Next, the PR layer is removed. Next, the seed layer and adhesion/barrier layer not under the metal posts are removed. Next, a reflow process is performed. The metal bumps can be used to be connected to electrical contact pads formed on a glass substrate, flexible substrate, TAB carrier, printed circuit board or another semiconductor chip.

Figure 10:
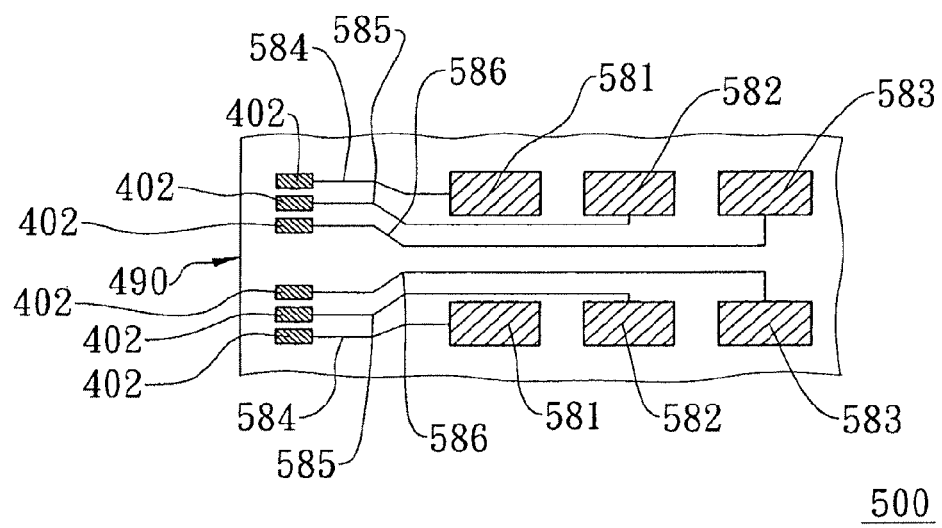
FIG. 10 illustrates a top view of an alternative semiconductor chip according to the invention.

FIG. 10 is an embodiment of the invention to show a top view of a semiconductor chip. The patterned metal layer formed over the passivation layer and on the contact pads exposed by the openings in the passivation layer includes multiple contact pads 581, 582 and 583 and traces 584, 585 and 586. The contact pads 581, 582 and 583 used to be wirebonded thereto or have metal bumps formed thereon can be aligned in three lines along an edge 490 of the semiconductor chip 500. Multiple traces 586 of the patterned metal layer connecting the contact pads 402 exposed by the openings in the passivation layer to the contact pads 583 aligned in the internal line pass through the gap between the neighboring contact pads 581 aligned in the external line and the gap between the neighboring contact pads 582 aligned in the middle line. Multiple traces 585 of the patterned metal layer connecting the contact pads 402 exposed by the openings in the passivation layer to the contact pads 582 aligned in the middle line pass through the gap between the neighboring contact pads 581 aligned in the external line. The process for forming the patterned metal layer and the metal bumps can be as referred to FIGS. 5A-5F. The patterned metal layer can be formed on the passivation layer without the polymer layer between the patterned metal layer and the passivation layer. Alternatively, the patterned metal layer can be formed on the polymer layer deposited on the passivation layer.

Preferably, the material of the metal bumps is soft and ductile to buffer and absorb the shock energy during assembling the semiconductor chip and an external circuitry or to buffer and absorb the shock energy during a probe or testing card is poked in the metal bumps. In accordance with the invention, the thicker the metal bumps are, the more energy the metal bumps absorb. The invention allows the semiconductor devices under the metal bumps without being damaged if a shock happens to the metal bumps.

The RDL layer is employed to change the I/O layout from the fine-pitched contact pads exposed by the opening in the passivation layer to the coarse-pitched contact pads formed over the fine-pitched contact pads or the passivation layer. Therefore, the process for wirebonding or forming metal bumps is easily performed.

In this invention, the peripheral region of the semiconductor substrate close to the edge thereof may have semiconductor devices formed therein or on. The rate of the semiconductor devices occupying the top surface of the semiconductor substrate is improved and therefore the semiconductor chip can be shrunk.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

One skilled in the art will understand that the embodiment of the present invention as shown in the drawings and described above is exemplary only and not intended to be limiting.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A chip comprising:
 a silicon substrate;
 a MOS device in or on said silicon substrate;
 a first metal layer over said silicon substrate;
 a second metal layer over said first metal layer;
 a dielectric layer between said first and second metal layers;
 an insulating layer over said first and second metal layers and said dielectric layer, wherein said insulating layer comprises a nitride layer;
 a first metal interconnect having a first contact point at a bottom of a first opening in said insulating layer, wherein said first opening is over said first contact point;
 a second metal interconnect having a second contact point at a bottom of a second opening in said insulating layer, wherein said second opening is over said second contact point;
 a third metal interconnect having a third contact point at a bottom of a third opening in said insulating layer, wherein said third opening is over said third contact point, wherein said first, second and third metal interconnects comprise electroplated copper, wherein said first, second and third contact points are aligned in a first line, wherein said second contact point is between said first and third contact points;

a patterned metal layer on said first, second and third contact points and over said insulating layer, wherein said patterned metal layer comprises a first adhesion layer and a third metal layer over said first adhesion layer, wherein said third metal layer has a sidewall not covered by said first adhesion layer, wherein said patterned metal layer comprises a first metal trace over said insulating layer, wherein said first metal trace is connected to said first contact point through said first opening, a first contact pad connected to said first contact point through said first metal trace, wherein said first contact pad is not vertically over said first contact point, a second metal trace over said insulating layer, wherein said second metal trace is connected to said second contact point through said second opening, a second contact pad connected to said second contact point through said second metal trace, wherein said second contact pad is not vertically over said second contact point, a third metal trace over said insulating layer, wherein said third metal trace is connected to said third contact point through said third opening, and a third contact pad connected to said third contact point through said third metal trace, wherein said third contact pad is not vertically over said third contact point, wherein said second metal trace extends between said first and third contact pads;

a first metal bump on said first contact pad and not vertically over said first contact point, wherein said first metal bump comprises a second adhesion layer and a gold layer with a height between 1 and 50 micrometers over said second adhesion layer;

a second metal bump on said second contact pad and not vertically over said second contact point; and a third metal bump on said third contact pad and not vertically over said third contact point, wherein said first and third metal bumps are aligned in a second line substantially parallel with said first line.

2. The chip of claim 1, wherein said insulating layer comprises an oxide.

3. The chip of claim 1, wherein said insulating layer comprises a nitride.

4. The chip of claim 1, wherein said insulating layer comprises an oxide layer having a thickness between 0.2 and 1 micrometer.

5. The chip of claim 1, wherein said second adhesion layer comprises titanium.

6. The chip of claim 1, wherein said gold layer has more than 95 percent by weight of gold.

7. The chip of claim 1, wherein said first adhesion layer comprises titanium.

8. The chip of claim 1, wherein said third metal layer comprises copper.

9. The chip of claim 1, wherein no polymer layer is between said patterned metal layer and said insulating layer.

10. The chip of claim 1 further comprising a capping layer on said patterned metal layer.

11. A chip comprising:
a silicon substrate;
a MOS device in or on said silicon substrate;
a first metal layer over said silicon substrate;
a second metal layer over said first metal layer;
a dielectric layer between said first and second metal layers;
an insulating layer over said first and second metal layers and said dielectric layer, wherein said insulating layer comprises a nitride layer;

a first metal interconnect having a first contact point at a bottom of a first opening in said insulating layer, wherein said first opening is over said first contact point;

a second metal interconnect having a second contact point at a bottom of a second opening in said insulating layer, wherein said second opening is over said second contact point;

a third metal interconnect having a third contact point at a bottom of a third opening in said insulating layer, wherein said third opening is over said third contact point, wherein said first, second and third metal interconnects comprise electroplated copper, wherein said first, second and third contact points are aligned in a first line, wherein said second contact point is between said first and third contact points;

a patterned metal layer on said first, second and third contact points and over said insulating layer, wherein said patterned metal layer comprises a first adhesion layer and a third metal layer over said first adhesion layer, wherein said third metal layer has a sidewall not covered by said first adhesion layer;

a first metal bump on said patterned metal layer, wherein said patterned metal layer connects said first metal bump to said first contact point through said first opening, wherein said first metal bump comprises a second adhesion layer and a gold layer with a height between 1 and 50 micrometers over said second adhesion layer;

a second metal bump on said patterned metal layer, wherein said patterned metal layer connects said second metal bump to said second contact point through said second opening; and a third metal bump on said patterned metal layer, wherein said patterned metal layer connects said third metal bump to said third contact point through said third opening, wherein said first, second and third metal bumps are aligned in a second line substantially parallel with said first line.

12. The chip of claim 11, wherein said insulating layer comprises an oxide.

13. The chip of claim 11, wherein said insulating layer comprises a nitride.

14. The chip of claim 11, wherein said insulating layer comprises an oxide layer having a thickness between 0.2 and 1 micrometer.

15. The chip of claim 11, wherein said second adhesion layer comprises titanium.

16. The chip of claim 11, wherein said gold layer has more than 95 percent by weight of gold.

17. The chip of claim 11, wherein said first adhesion layer comprises titanium.

18. The chip of claim 11, wherein said third metal layer comprises copper.

19. The chip of claim 11, wherein no polymer layer is between said patterned metal layer and said insulating layer.

20. The chip of claim 11 further comprising a capping layer on said patterned metal layer.

21. A chip comprising:
a silicon substrate;
a MOS device in or on said silicon substrate;
a first dielectric layer over said silicon substrate;
a metallization structure over said first dielectric layer, wherein said metallization structure comprises a first metal layer and a second metal layer over said first metal layer, wherein said metallization structure comprises electroplated copper;
a second dielectric layer over said first dielectric layer and between said first and second metal layers;

an insulating layer over said metallization structure and said first and second dielectric layers, wherein a first opening in said insulating layer is over a first contact point of said metallization structure, and said first contact point is at a bottom of said first opening, and wherein a second opening in said insulating layer is over a second contact point of said metallization structure, and said second contact point is at a bottom of said second opening, wherein said insulating layer comprises a nitride layer;

a patterned metal layer on said first and second contact points and over said insulating layer, wherein said patterned metal layer comprises a first metal interconnect connected to said first contact point through said first opening, a second metal interconnect connected to said second contact point through said second opening, and a third metal interconnect between said first and second metal interconnects, wherein said patterned metal layer comprises a first adhesion layer and a third metal layer over said first adhesion layer, wherein said third metal layer has a sidewall not covered by said first adhesion layer;

a first metal bump on said first metal interconnect and vertically over said first contact point;

a second metal bump on said second metal interconnect and vertically over said second contact point, wherein there is no metal bump between said first and second metal bumps, wherein said third metal interconnect has a portion between and spaced apart from said first metal interconnect vertically under said first metal bump and said second metal interconnect vertically under said second metal bump; and a third metal bump aligned with said first and second metal bumps.

22. The chip of claim 21 further comprising a polymer layer over said patterned metal layer.

23. The chip of claim 21, wherein said first metal bump comprises a second adhesion layer on said first metal interconnect and a copper layer over said second adhesion layer.

24. The chip of claim 23, wherein said second adhesion layer comprises titanium.

25. The chip of claim 23, wherein said copper layer has a thickness between 0.5 and 10 micrometers.

26. The chip of claim 23, wherein said first metal bump further comprises a nickel layer on said copper layer.

27. The chip of claim 26, wherein said nickel layer has a thickness between 0.5 and 10 micrometers.

28. The chip of claim 26, wherein said first metal bump further comprises a tin-containing layer on said nickel layer.

29. The chip of claim 21, wherein said insulating layer comprises an oxide.

30. The chip of claim 21, wherein said insulating layer comprises a nitride.

31. The chip of claim 21, wherein said insulating layer comprises an oxide layer having a thickness between 0.2 and 1 micrometer.

32. The chip of claim 21, wherein said third metal layer comprises copper.

33. The chip of claim 21, wherein no polymer layer is between said patterned metal layer and said insulating layer.

* * * * *